(12) United States Patent
Tsunai et al.

(10) Patent No.: US 10,574,918 B2
(45) Date of Patent: Feb. 25, 2020

(54) IMAGE PICKUP ELEMENT AND IMAGE PICKUP DEVICE

(71) Applicant: NIKON CORPORATION, Tokyo (JP)

(72) Inventors: Shiro Tsunai, Kawasaki (JP); Hironobu Murata, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/266,602

(22) Filed: Feb. 4, 2019

(65) Prior Publication Data

US 2019/0182446 A1 Jun. 13, 2019

Related U.S. Application Data

(63) Continuation of application No. 15/793,495, filed on Oct. 25, 2017, now Pat. No. 10,244,194, which is a (Continued)

(30) Foreign Application Priority Data

Mar. 30, 2012 (JP) ................................. 2012-082158
May 1, 2012 (JP) ................................. 2012-104830

(51) Int. Cl.
*H04N 5/374* (2011.01)
*H04N 5/3745* (2011.01)
(Continued)

(52) U.S. Cl.
CPC ..... *H04N 5/37455* (2013.01); *H01L 27/1464* (2013.01); *H01L 27/14634* (2013.01);
(Continued)

(58) Field of Classification Search
CPC .................................................. H04N 5/37455
(Continued)

(56) References Cited

U.S. PATENT DOCUMENTS 7,045,835 B2 5/2006 Layman et al.
7,068,315 B1 6/2006 Suzuki et al.
(Continued)

FOREIGN PATENT DOCUMENTS

CN 102007761 A 4/2011
DE 10 2010 028 746 A1 11/2011
(Continued)

OTHER PUBLICATIONS

Aug. 18, 2015 Search Report issued in European Application No. 13769477.4.
(Continued)

*Primary Examiner* — Joel W Fosselman
(74) *Attorney, Agent, or Firm* — Oliff PLC

(57) ABSTRACT

An imaging element includes: an imaging unit in which a plurality of pixel groups including a plurality of pixels that output pixel signals according to incident light are formed, and on which incident light corresponding to mutually different pieces of image information is incident; a control unit that controls, for each of the pixel groups, a period of accumulating in the plurality of pixels included in the pixel group; and a readout unit that is provided to each of the pixel groups, and reads out the pixel signals from the plurality of pixels included in the pixel group.

20 Claims, 17 Drawing Sheets

Related U.S. Application Data continuation of application No. 14/492,336, filed on Sep. 22, 2014, now abandoned, which is a continuation of application No. PCT/JP2013/002119, filed on Mar. 28, 2013, now abandoned.

(51) Int. Cl.
| | |
|---|---|
| *H04N 5/353* | (2011.01) |
| *H04N 9/04* | (2006.01) |
| *H04N 5/378* | (2011.01) |
| *H01L 27/146* | (2006.01) |
| *H04N 5/369* | (2011.01) |
| *H04N 5/355* | (2011.01) |

(52) U.S. Cl.
CPC ..... *H01L 27/14641* (2013.01); *H04N 5/3537* (2013.01); *H04N 5/35554* (2013.01); *H04N 5/378* (2013.01); *H04N 5/379* (2018.08); *H04N 5/37457* (2013.01); *H04N 9/045* (2013.01)

(58) Field of Classification Search
USPC .......................................................... 348/308
See application file for complete search history.

(56) References Cited

U.S. PATENT DOCUMENTS

| | | | |
|---|---|---|---|
| 8,345,108 B2 | 1/2013 | Kobayashi | |
| 8,384,807 B2 | 2/2013 | Yamada | |
| 8,508,639 B2 | 8/2013 | Mabuchi et al. | |
| 8,792,034 B2 | 7/2014 | Takahashi | |
| 2003/0035059 A1 | 2/2003 | Suzuki | |
| 2004/0095495 A1 | 5/2004 | Inokuma et al. | |
| 2006/0023109 A1 | 2/2006 | Mabuchi et al. | |
| 2006/0098115 A1 | 5/2006 | Toyoda | |
| 2006/0103745 A1 | 5/2006 | Nagaishi et al. | |
| 2007/0076269 A1 | 4/2007 | Kido et al. | |
| 2007/0096011 A1 | 5/2007 | Sato et al. | |
| 2008/0074534 A1 | 3/2008 | Kusaka | |
| 2008/0174235 A1 | 7/2008 | Kim et al. | |
| 2009/0021625 A1 | 1/2009 | Sowa et al. | |
| 2009/0091645 A1 | 4/2009 | Trimeche et al. | |
| 2009/0268055 A1 | 10/2009 | Hamilton, Jr. et al. | |
| 2010/0193923 A1* | 8/2010 | Tanaka | B81B 7/007 257/676 |
| 2010/0214453 A1* | 8/2010 | Murata | G02B 3/0056 348/266 |
| 2011/0285886 A1 | 11/2011 | Kato et al. | |
| 2012/0127337 A1 | 5/2012 | Okada et al. | |
| 2012/0200749 A1 | 8/2012 | Boettiger et al. | |

FOREIGN PATENT DOCUMENTS

| | | |
|---|---|---|
| JP | S62-241467 A | 10/1987 |
| JP | 2001-024952 A | 1/2001 |
| JP | 2003-032552 A | 1/2003 |
| JP | 2004-146816 A | 5/2004 |
| JP | 2004-282552 A | 10/2004 |
| JP | 2006-049361 A | 2/2006 |
| JP | 2006-157862 A | 6/2006 |
| JP | 2007-208885 A | 8/2007 |
| JP | 2008-85535 A | 4/2008 |
| JP | 2010-183357 A | 8/2010 |
| JP | 2010-539745 A | 12/2010 |
| JP | 2012-175234 A | 9/2012 |
| WO | 2012004928 A1 | 1/2012 |

OTHER PUBLICATIONS

Oct. 21, 2016 Office Action Issued in U.S. Appl. No. 14/492,336.
May 25, 2017 Office Action Issued in U.S. Appl. No. 14/492,336.
Apr. 20, 2017 Office Action issued in European Patent Application No. 13769477.4.
May 30, 2017 Office Action issued in Japanese Patent Application No. 2014-507443.
Sep. 21, 2015 Office Action Issued in U.S. Appl. No. 14/492,336.
May 4, 2016 Office Action Issued in U.S. Appl. No. 14/492,336.
May 7, 2013 Search Report issued in International Application No. PCT/JP2013/002119.
Oct. 1, 2014 International Preliminary Report on Patentability issued in International Application No. PCT/JP2013/002119.
Mar. 13, 2018 Office Action issued in U.S. Appl. No. 15/793,495.
Feb. 27, 2018 Office Action issued in Japanese Application No. 2014-507443.
Feb. 26, 2018 Office Action issued in European Application No. 13 769 477.4.
Nov. 22, 2018 Office Action issued in European Application No. 13 769 477.4.
Dec. 31, 2018 Office Action issued in Indian Application No. 8388/DELNP/2014.
Mar. 29, 2019 Office Action issued in Chinese Patent Application No. 201380016350.0.
Oct. 29, 2019 Office Action issued in Japanese Patent Application No. 2018-170390.

* cited by examiner

IMAGE PICKUP ELEMENT AND IMAGE PICKUP DEVICE

CROSS REFERENCE TO RELATED APPLICATION

This is a continuation of U.S. patent application Ser. No. 15/793,495 filed Oct. 25, 2017, which in turn is a continuation of U.S. patent application Ser. No. 14/492,336, filed Sep. 22, 2014. The contents of these U.S. applications and the following Japanese and International patent applications are incorporated herein by reference:
 2012-082158 filed in JP on Mar. 30, 2012,
 2012-104830 filed in JP on May 1, 2012, and
 PCT/JP2013/002119 filed on Mar. 28, 2013.

BACKGROUND

1. Technical Field

The present invention relates to an imaging element and an imaging device.

2. Related Art

An imaging unit in which a backside irradiating type imaging chip and a signal processing chip are connected, via microbumps, for each cell unit including a plurality of pixels is known.

PRIOR ART DOCUMENTS

Patent Literatures

[Patent Literature 1] Japanese patent application Publication No. 2006-49361

SUMMARY

In the above-described imaging unit, a period of accumulating electrical charges and readout of pixel signals are controlled on a cell-by-cell basis. However, because the above-described cell each includes a group of two-dimensionally adjacent pixels, the period of accumulating electrical charges and the readout of pixel signals cannot be minutely controlled within a cell or for different cells.

According to a first aspect of the present invention, an imaging element comprises:
 an imaging unit in which a plurality of pixel groups including a plurality of pixels that output pixel signals according to incident light are formed, and on which incident light corresponding to mutually different pieces of image information is incident;
 a control unit that controls, for each of the pixel groups, a period of accumulating in the plurality of pixels included in the pixel group; and
 a readout unit that is provided to each of the pixel groups, and reads out the pixel signals from the plurality of pixels included in the pixel group.

According to a second aspect of the present invention, an imaging device that uses the above-described imaging element is provided.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
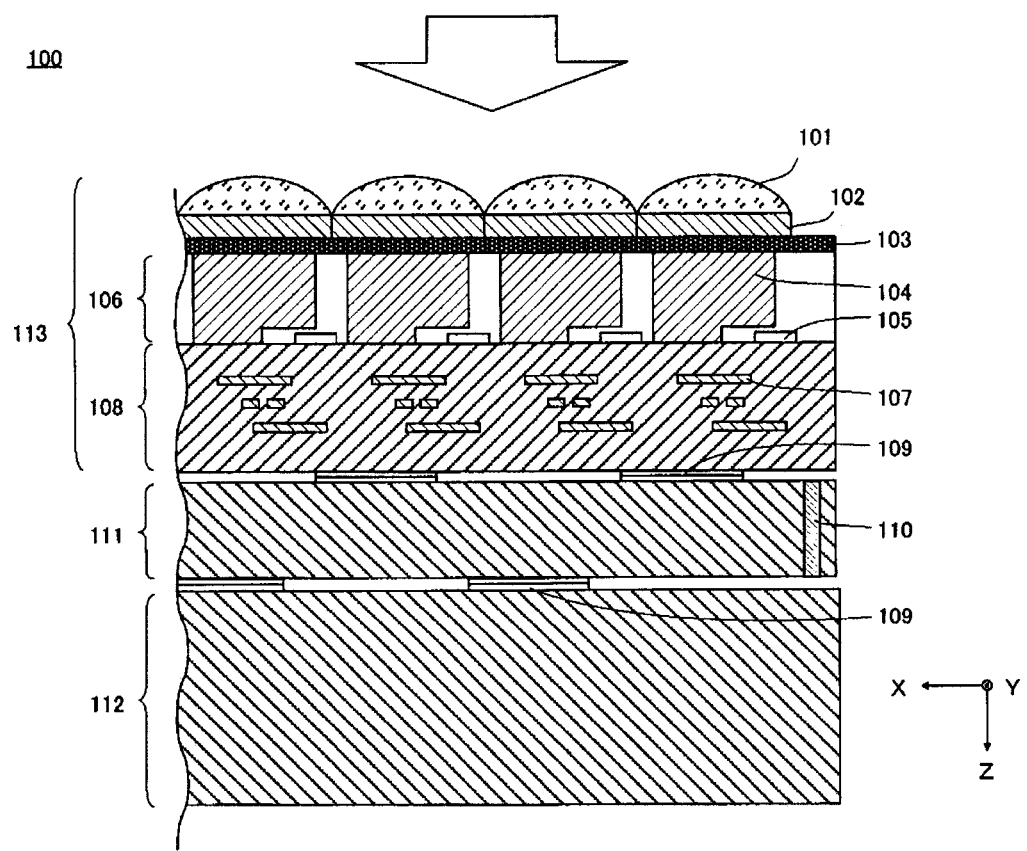
FIG. 1 is a sectional view of a backside irradiating type MOS imaging element according to the present embodiment.

FIG. 1 is a sectional view of a backside irradiating type imaging element 100 according to the present embodiment. The imaging element 100 includes an imaging chip 113 that outputs a pixel signal corresponding to incident light, a signal processing chip 111 that processes the pixel signal, and a memory chip 112 that stores the pixel signal. These imaging chip 113, signal processing chip 111, and memory chip 112 are layered, and are electrically connected with each other via conductive bumps 109, such as Cu.

Note that, as illustrated, incident light is incident mainly in the Z axis positive direction that is indicated with an outlined arrow. In the present embodiment, the surface of the imaging chip 113 on a side on which the incident light is incident is called a backside. Also, as indicated with coordinate axes, the leftward direction on the figure that is orthogonal to the Z axis is referred to as the X axis positive direction, and the front side direction in the figure that is orthogonal to the Z and X axes is referred to as the Y axis positive direction. In several figures mentioned below, the coordinate axes are displayed such that the orientation of each figure can be known on the basis of the coordinate axes in FIG. 1.

One example of the imaging chip 113 is a backside irradiating type MOS image sensor. A PD layer is disposed on a backside of an interconnection layer 108. A PD layer 106 has a plurality of PDs (photo diodes) 104 that are two-dimensionally disposed, and transistors 105 provided corresponding to the PDs 104.

Color filters 102 are provided on the incident light incidence side of the PD layer 106 via a passivation film 103. There are a plurality of types of the color filters 102 that allow passage of mutually different wavelength ranges, and the color filters 102 are arrayed particularly corresponding to the respective PDs 104. The arrays of the color filters 102 are described below. A set of the color filter 102, the PD 104, and the transistor 105 forms one pixel.

A microlens 101 is provided, corresponding to each pixel, on the incident light incidence side of the color filter 102. The microlens 101 condenses incident light toward the corresponding PD 104.

The interconnection layer 108 has interconnections 107 that transmit a pixel signal from the PD layer 106 to the signal processing chip 111. The interconnection 107 may be a multilayer, and may be provided with a passive element and an active element.

A plurality of the bumps 109 is disposed on a surface of the interconnection layer 108. The plurality of bumps 109 are aligned with a plurality of the bumps 109 that are provided on the opposing surface of the signal processing chip 111, and, for example, the imaging chip 113 and the signal processing chip 111 are pressed against each other; thereby, the aligned bumps 109 are bonded and electrically connected with each other.

Similarly, a plurality of the bumps 109 are disposed on the mutually opposing surfaces of the signal processing chip 111 and the memory chip 112. These bumps 109 are aligned with each other, and, for example, the signal processing chip 111 and the memory chip 112 are pressed against each other; thereby, the aligned bumps 109 are bonded and electrically connected with each other.

Note that bonding between the bumps 109 is not limited to Cu bump bonding by solid phase diffusion, but microbump joining by solder melting may be adopted. Also, approximately one bump 109 may be provided, for example, for each output interconnection described below. Accordingly, the size of the bumps 109 may be larger than the pitch of the PDs 104. Also, in a peripheral area other than a pixel area where pixels are arrayed, a bump that is larger than the bumps 109 corresponding to the pixel area may also be provided.

The signal processing chip 111 has a TSV (through-silicon via) 110 that connects circuits that are provided on a frontside and a backside, respectively. The TSV 110 is preferably provided in the peripheral area. Also, the TSV 110 may be provided also in the peripheral area of the imaging chip 113, and the memory chip 112.

Figure 2:
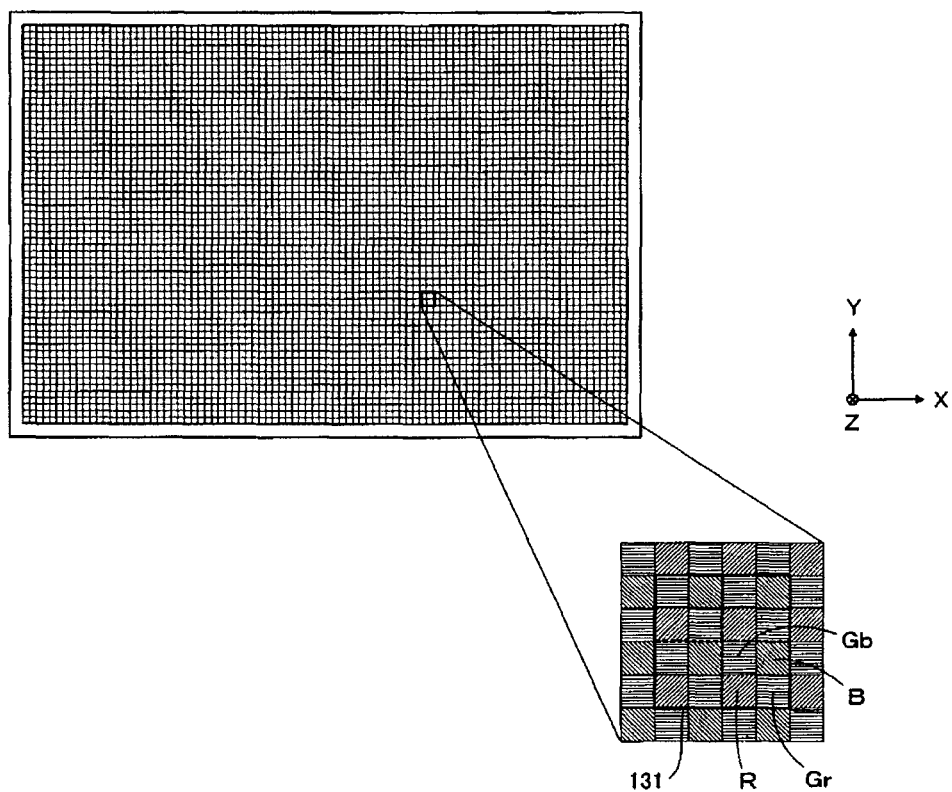
FIG. 2 is a diagram for explaining a pixel array and a unit group of an imaging chip.

FIG. 2 is a diagram for explaining a pixel array and a unit group 131 of the imaging chip 113. In particular, the figure shows a state of the imaging chip 113 as observed from the backside. A matrix of twenty million pixels or more are arrayed on the pixel area. In the present embodiment, adjacent four pixels×four pixels, 16 pixels, form one group. Grid lines in the figure show the concept that adjacent pixels are grouped to form the unit group 131.

As illustrated in the partially enlarged view of the pixel area, the unit group 131 includes, within its upper left, upper right, lower left, and lower right portions, four so-called Bayer arrays each consisting of four pixels including green pixels Gb, Gr, a blue pixel B, and a red pixel R. The green pixels Gb, Gr have green filters as the color filters 102, and receive light in the green wavelength band of incident light.

Similarly, the blue pixel B has a blue filter as the color filter 102, and receives light in the blue wavelength band, and the red pixel R has a red filter as the color filter 102, and receives light in the red wavelength band.

Figure 3:
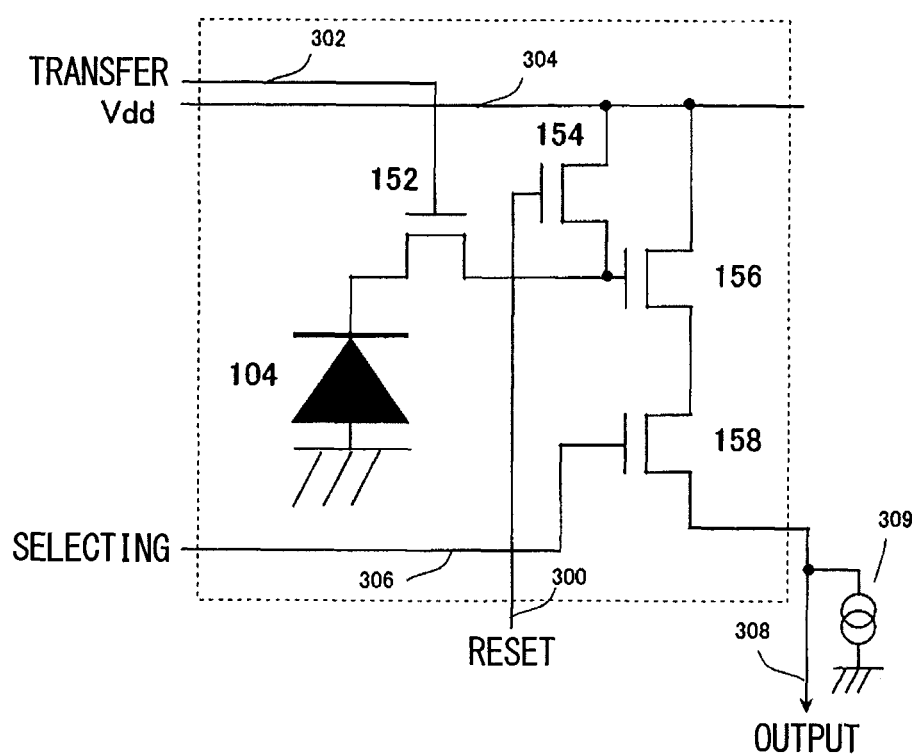
FIG. 3 is an equivalent circuit schematic of a pixel.

FIG. 3 illustrates an equivalent circuit schematic of a pixel 150. Each of a plurality of the above-described pixels 150 has the above-described PD 104, a transfer transistor 152, a reset transistor 154, an amplifying transistor 156, and a selecting transistor 158. At least a part of these transistors corresponds to the transistor 105 in FIG. 1. Furthermore, a reset interconnection 300 to which an ON signal of the reset transistor 154 is supplied; a transfer interconnection 302 to which an ON signal of the transfer transistor 152 is supplied; a power supply interconnection 304 that receives power supply from a power supply Vdd; a selecting interconnection 306 to which an ON signal of the selecting transistor 158 is supplied; and an output interconnection 308 that outputs pixel signals are disposed in the pixel 150. Although each transistor is explained as an n-channel type FET as an example, the type of the transistors is not limited thereto.

The source, gate, and drain of the transfer transistor 152 are connected with one end of the PD 104, the transfer interconnection 302, and the gate of the amplifying transistor 156, respectively. Also, the drain and source of the reset transistor 154 are connected with the power supply interconnection 304, and the gate of the amplifying transistor 156, respectively. The drain and source of the amplifying transistor 156 are connected with the power supply interconnection 304, and the drain of the selecting transistor 158, respectively. The gate and source of the selecting transistor 158 are connected with the selecting interconnection 306 and the output interconnection 308, respectively. A load current source 309 supplies current to the output interconnection 308. That is, the output interconnection 308 for the selecting transistor 158 is formed by a source follower. Note that the load current source 309 may be provided on the imaging chip 113 side or may be provided on the signal processing chip 111 side.

Figure 4:
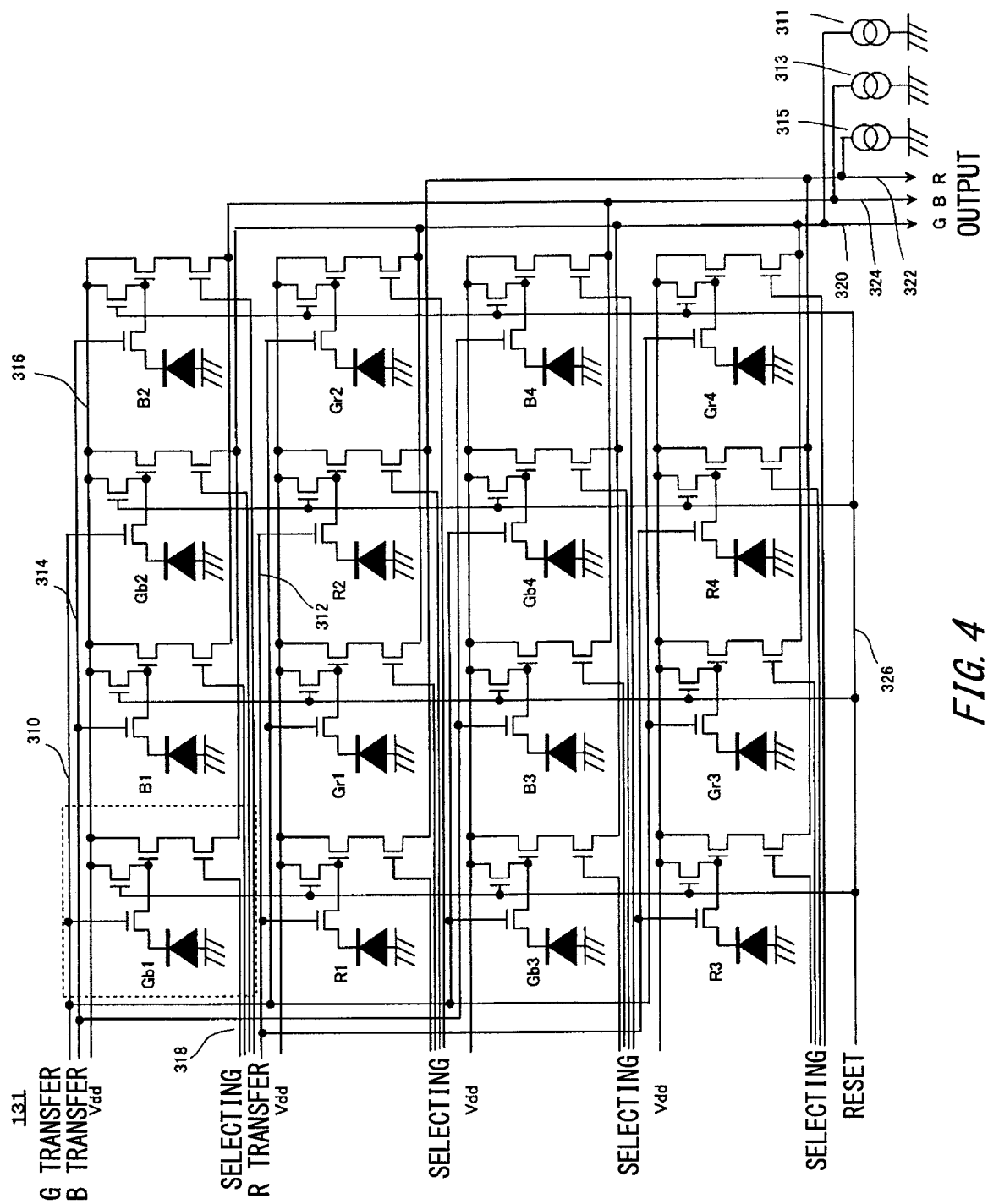
FIG. 4 is a schematic showing a relationship among connections between pixels in a unit group.

FIG. 4 is a schematic that shows a relationship of connections among the above-described pixels 150 in the unit group 131. Note that, although the reference number of each transistor is omitted for the purpose of making it easy to see the figure, each transistor of each pixel in FIG. 4 has the same configuration and functions as those of each transistor disposed at a corresponding position within the pixel 150 in FIG. 3.

The pixels 150 having the color filters 102 of the same color form a pixel group within the unit group 131 illustrated in FIG. 4. Corresponding to the fact that there are three types, RGB, of the color filters 102 as illustrated in FIG. 2, eight pixels, pixels Gb1, Gb2, Gb3, Gb4, Gr1, Gr2, Gr3, Gr4, form a G pixel group. Similarly, four pixels, pixels R1, R2, R3, R4, form an R pixel group, and four pixels, pixels B1, B2, B3, B4, form a B pixel group. That is, a pixel group is formed for each wavelength range that is transmitted through the color filters 102.

Here, the gates of the transfer transistors of a plurality of pixels included in each pixel group share a connection. Thereby, the gates of the transfer transistors of the pixels belonging to a pixel group are controlled all at once, and independently of other pixel groups.

In the example illustrated in FIG. 4, the gates of transfer transistors of the pixels Gb1, Gb2, Gb3, Gb4, Gr1, Gr2, Gr3, Gr4 included in the G pixel group are connected with a common G transfer interconnection 310. Similarly, the gates of transfer transistors of the pixels R1, R2, R3, R4 in the R pixel group are connected with a common R transfer interconnection 312, and the gates of transfer transistors of the pixels B1, B2, B3, B4 in the B pixel group are connected with a common B transfer interconnection 314.

Also, the sources of the selecting transistors of a plurality of pixels included in each pixel group share a connection. The sources of selecting transistors of the pixels Gb1, Gb2, Gb3, Gb4, Gr1, Gr2, Gr3, Gr4 in the G pixel group are connected with a common G output interconnection 320. Similarly, the sources of selecting transistors of the pixels R1, R2, R3, R4 in the R pixel group are connected with a common R output interconnection 322, and the sources of selecting transistors of the pixels B1, B2, B3, B4 in the B pixel group are connected with a common B output interconnection 324.

A load current source 311 is connected with the G output interconnection 320. Similarly, a load current source 313 is connected with the R output interconnection 322, and a load current source 315 is connected with the B output interconnection 324. Note that a reset interconnection 326 and a power supply interconnection 316 are shared within the unit group 131. Also, there are 16 selecting interconnections 318 each of which are disposed for each pixel and connected with the gate of a corresponding selecting transistor.

In this manner, a plurality of output interconnections are provided to the single unit group 131. However, because the imaging chip 113 is a backside irradiating type, the number of layers of the interconnections 107 of the imaging chip 113 can be increased without reducing the amount of light incident on the PDs 104, and the interconnections can be routed without increasing the size in the plane direction.

Figure 5:
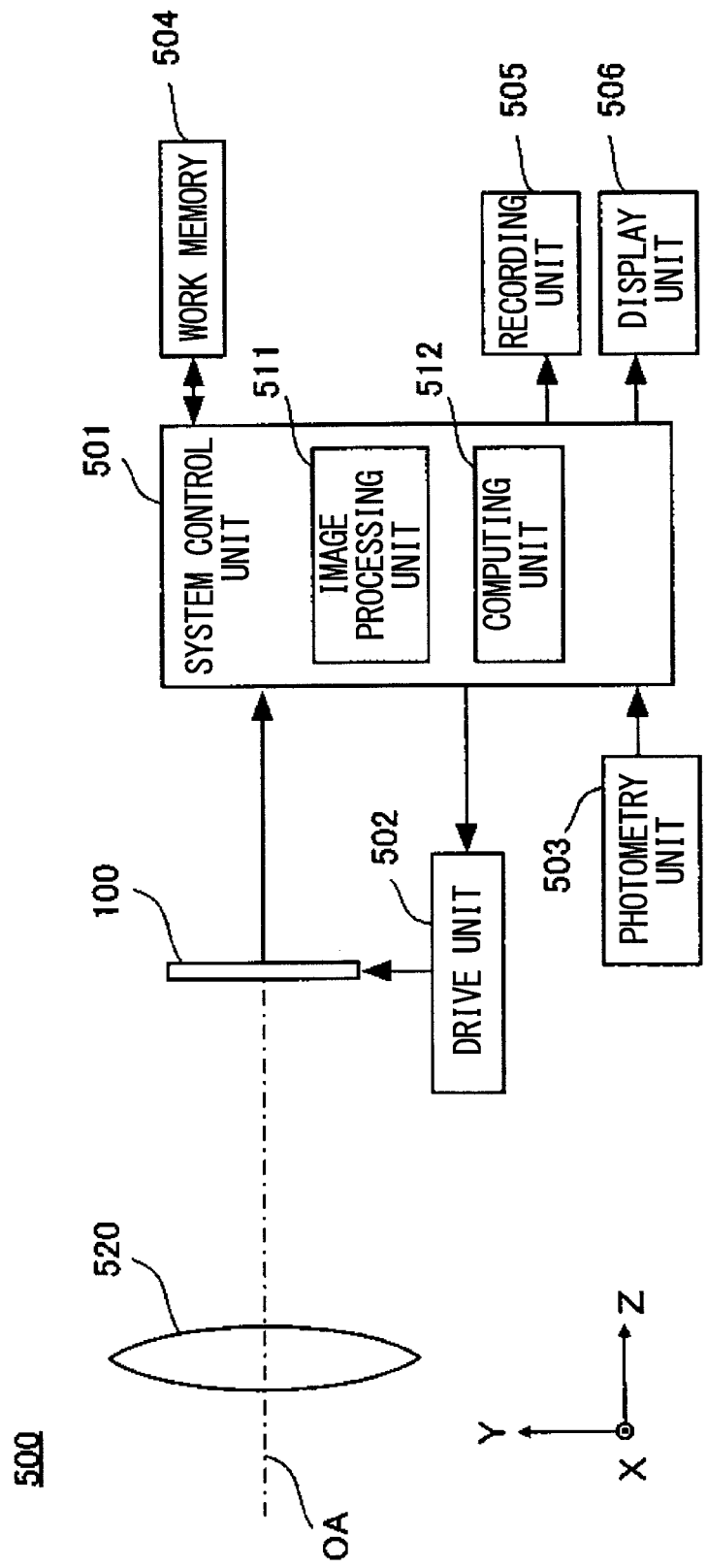
FIG. 5 is a block diagram showing a configuration of an imaging device according to the present embodiment.

FIG. 5 is a block diagram illustrating a configuration of an imaging device according to the present embodiment. An imaging device 500 includes an imaging lens 520 as an imaging optical system, and the imaging lens 520 guides a subject luminous flux that is incident along an optical axis OA to the imaging element 100. The imaging lens 520 may be a replaceable lens that can be attached/detached to and from the imaging device 500. The imaging device 500 includes, mainly, the imaging element 100, a system control unit 501, a drive unit 502, a photometry unit 503, a work memory 504, a recording unit 505, and a display unit 506.

The imaging lens 520 is configured with a plurality of optical lens groups, and forms an image of a subject luminous flux from a scene near its focal plane. Note that, in FIG. 5, the imaging lens 520 is representatively shown with a single virtual lens that is placed near the pupil. The drive unit 502 is a control circuit that executes electrical charge accumulation control such as timing control and area control of the imaging element 100 according to instructions from the system control unit 501. In this sense, it can be said that the drive unit 502 serves functions of an imaging element control unit that causes the imaging element 100 to execute electrical charge accumulation and output pixel signals. The drive unit 502 forms an imaging unit, in combination with the imaging element 100. The control circuit that forms the drive unit 502 may be formed as a chip, and layered on the imaging element 100.

The imaging element 100 passes pixel signals to an image processing unit 511 of the system control unit 501. The image processing unit 511 performs various types of image processing by using the work memory 504 as a workspace, and generates image data. For example, when image data in a JPEG file format is generated, white balance processes, gamma processes, and the like are executed, and then compression processes are executed. The generated image data is recorded in the recording unit 505 and converted into display signals, and is displayed on the display unit 506 for a preset period of time.

The photometry unit 503 detects luminance distribution of a scene prior to an imaging sequence for generating image data. The photometry unit 503 includes an AE sensor of approximately one million pixels, for example. A computing unit 512 of the system control unit 501 calculates luminance of respective areas within a scene, upon receiving an output of the photometry unit 503. The computing unit 512 decides a shutter speed, a diaphragm value, and an ISO speed according to the calculated luminance distribution. Note that pixels used in the above-described AE sensor may be provided within the imaging element 100, and in this case, the photometry unit 503 that is separate from the imaging element 100 may not be provided.

Figure 6:
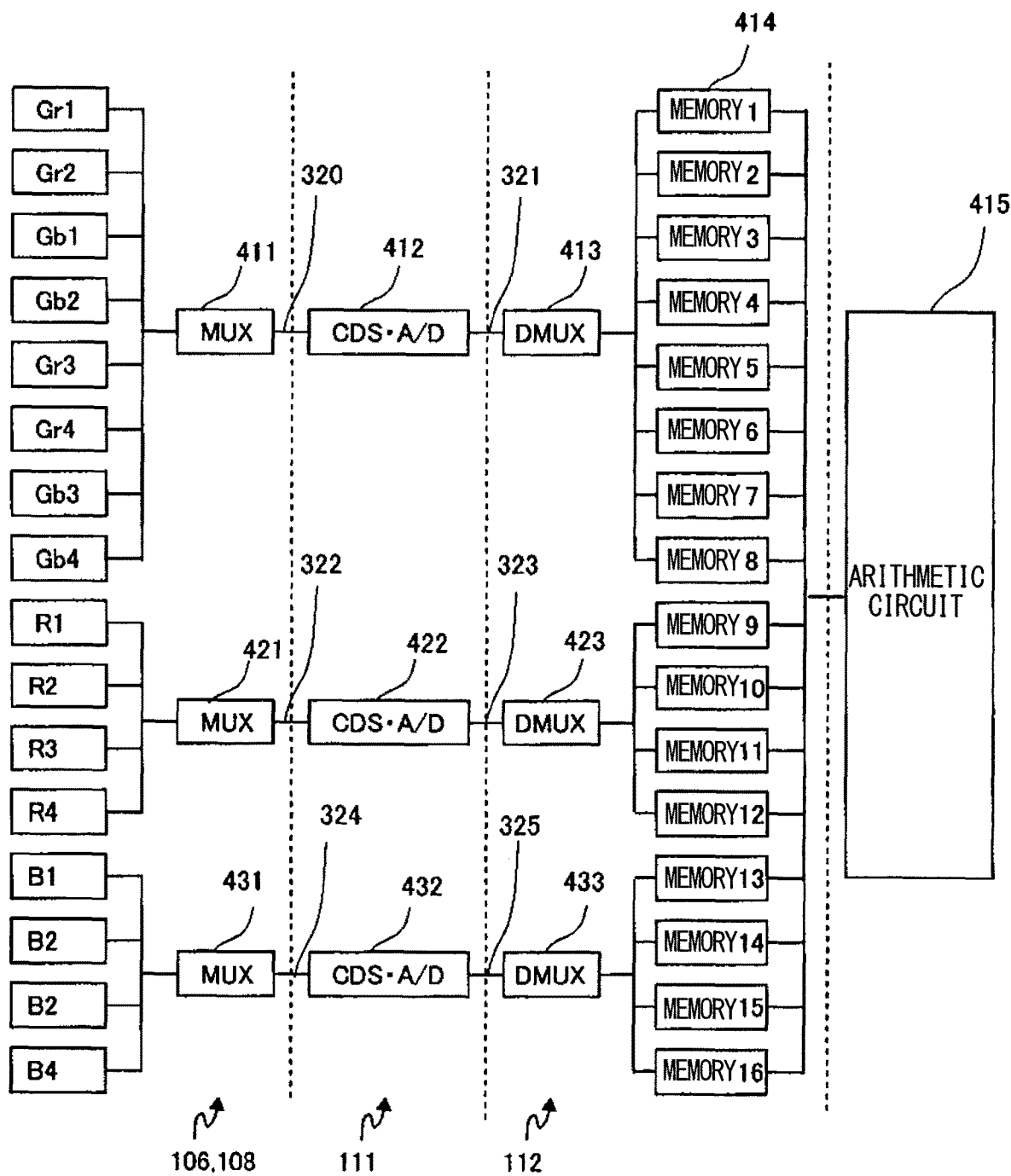
FIG. 6 is a block diagram showing a functional configuration of an imaging element.

FIG. 6 is a block diagram illustrating a functional configuration of the imaging element 100. An analog multiplexer 411 selects eight pixels Gb1 and the like in the G pixel group of the unit group 131 in turn, and causes their respective pixel signals to be output to the G output interconnection 320 and the like.

The pixel signals output via the multiplexer 411 are subjected to, via the G output interconnection 320, correlated double sampling (CDS) and analog/digital (A/D) conversion by a signal processing circuit 412 that performs CDS and A/D conversion. The A/D converted pixel signals are passed over to a de-multiplexer 413 via a G output interconnection 321, and are stored in pixel memories 414 corresponding to the respective pixels.

Similarly, a multiplexer 421 selects four pixels R1 and the like in the R pixel group of the unit group 131 in turn, and causes their respective pixel signals to be output to the R output interconnection 322. A signal processing circuit 422 performs CDS and A/D conversion on the pixel signals output by the R output interconnection 322. The A/D converted pixel signals are passed over to a de-multiplexer 423 via an R output interconnection 323, and are stored in the pixel memories 414 corresponding to the respective pixels.

Similarly, a multiplexer 431 selects four pixels B1 and the like in the B pixel group of the unit group 131 in turn, and causes their respective pixel signals to be output to the B output interconnection 324. A signal processing circuit 432 performs CDS and A/D conversion on the pixel signals output by the B output interconnection 324. The A/D converted pixel signals are passed over to a de-multiplexer 433 via a B output interconnection 325, and are stored in the pixel memories 414 corresponding to the respective pixels.

The multiplexers 411, 421, 431 are respectively formed on the imaging chip 113 by the selecting transistor 158 and the selecting interconnection 306 in FIG. 3. The signal processing circuits 412, 422, 432 are formed in the signal processing chip 111. Note that, in the example of FIG. 6, the three signal processing circuits 412, 422, 432 are provided corresponding to the G pixel group, the R pixel group, and the B pixel group. The de-multiplexer 413, 423, 433 and the pixel memories 414 are formed in the memory chip 112.

The G output interconnections 320, 321, the R output interconnections 322, 323, and the B output interconnections 324, 325 are provided corresponding to the G pixel group, the R pixel group, and the B pixel group in the unit group 131. Because the imaging element 100 is formed by layering the imaging chip 113, the signal processing chip 111, and the memory chip 112, the interconnections can be routed without increasing the size of each chip in the plane direction by using inter-chip electrical connections that use the bumps 109 for the interconnections.

An arithmetic circuit 415 processes the pixel signals stored in the pixel memories 414 and passes them over to an image processing unit in a subsequent step. The arithmetic circuit 415 may be provided in the signal processing chip 111, or may be provided in the memory chip 112. Note that although connections of one group are illustrated in the figure, such connections exist for each group in fact, and operate in parallel. Note that however the arithmetic circuit 415 may not exist for each group, but for example a single arithmetic circuit 415 may perform processing in sequence by referring to values in the pixel memories 414 corresponding to respective groups.

Figure 7:
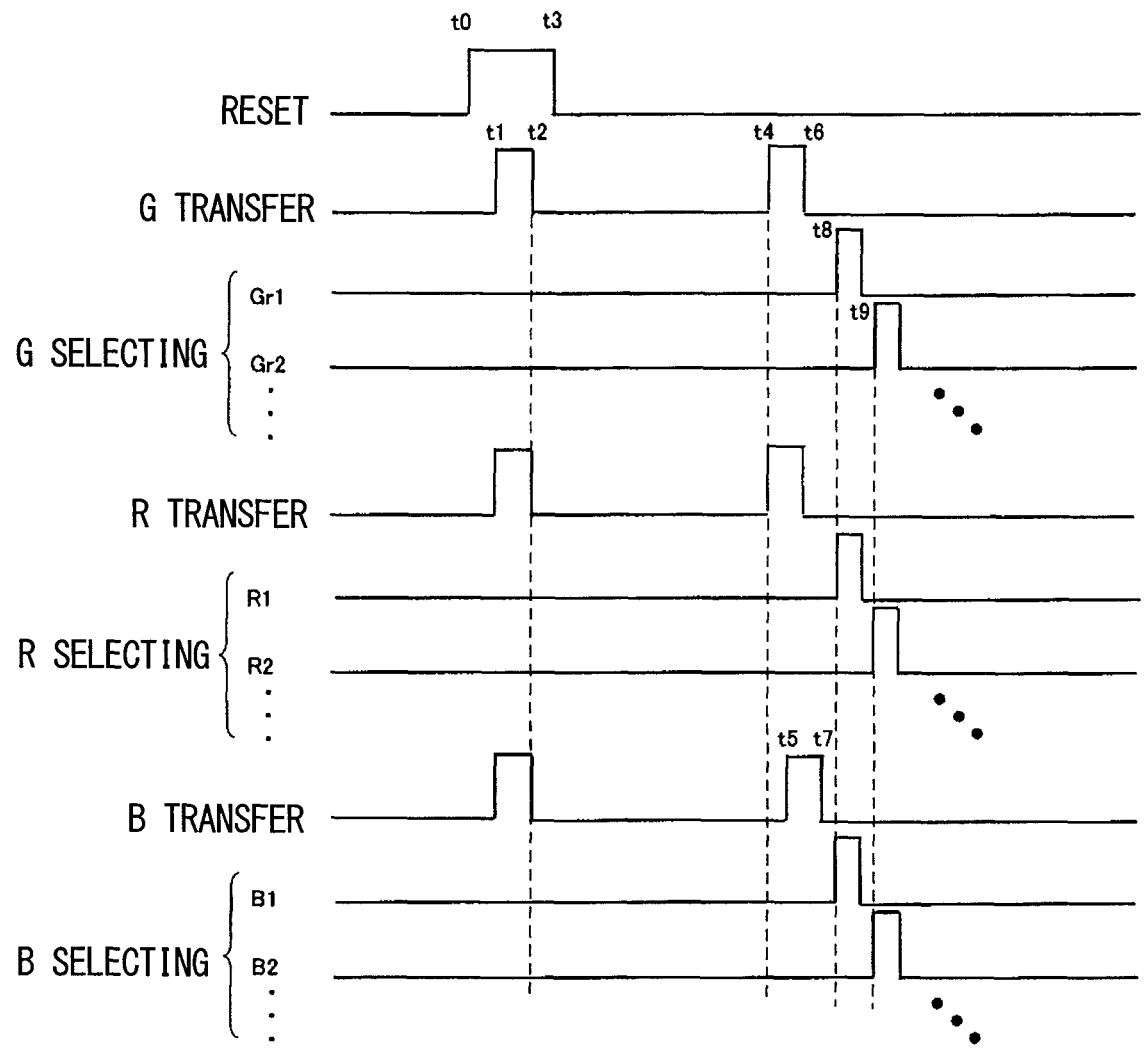
FIG. 7 shows a timing diagram of operations of each pixel group.

FIG. 7 illustrates a timing diagram of operations of each pixel group in FIG. 4. At a clock time t0, the drive unit 502 turns on reset transistors of the respective pixels Gb1 and the like in the unit group 131 via the reset interconnection 326. Thereby, electrical charges in the gates of amplifying transistors of the respective pixels Gb1 and the like are discarded, and the potential of the gates is reset. Furthermore, the drive unit 502 keeps the reset transistors of the respective pixels Gb1 and the like turned on, and from a clock time t1 to a clock time t2, turns on transfer transistors of the respective pixels Gb1 and the like belonging to the G pixel group via the G transfer interconnection 310. Thereby, electrical charges having been accumulated in PDs of the respective pixels Gb1 and the like belonging to the G pixel group are discarded.

Similarly, from the clock time t1 to the clock time t2, the drive unit 502 turns on transfer transistors of the respective pixels R1 and the like in the R pixel group and transistors of the respective pixels B1 and the like in the B pixel group via the R transfer interconnection 312 and the B transfer interconnection 314. Thereby, electrical charges having been accumulated in PDs of the respective pixels R1 and the like in the R pixel group and the respective pixels B1 and the like in the B pixel group are discarded. Thereafter, at a clock time t3, the drive unit 502 turns off the reset transistors of the respective pixels Gb1 and the like in the unit group 131 via the reset interconnection 326.

At a clock time t4 which is a predetermined accumulation period after the above-described clock time t2, the drive unit 502 turns on the transfer transistors of the respective pixels Gb1 and the like belonging to the G pixel group via the G transfer interconnection 310, and thereafter turns off the transfer transistors at a clock time t6. Thereby, electrical charges having been accumulated in the PDs between the clock times t2 and t4 in the respective pixels Gb1 and the like belonging to the G pixel group are transferred to the gates of the amplifying transistors via the transfer transistors all at once. Thereby, the drive unit 502 can control a period of accumulating electrical charges in the respective pixels Gb1 and the like belonging to the G pixel group collectively. Note that the accumulation period is, for example, the same with an exposure period.

In the example illustrated in FIG. 7, between the clock times t4 and t6, similarly to the G pixel group, the drive unit 502 turns on the transfer transistors of the respective pixels R1 and the like in the R pixel group via the R transfer interconnection 312. Thereby, electrical charges having been accumulated between the clock times t2 and t4 in the respective pixels R1 and the like in the R pixel group are transferred to the gates of the amplifying transistors via the transfer transistors all at once.

Also, in the example illustrated in FIG. 7, from a clock time t5 later than the clock time t4 to a clock time t7 which is a predetermined period of time after, the drive unit 502 turns on the transfer transistors of the respective pixels B1 and the like in the B pixel group via the B transfer interconnection 314. Thereby, electrical charges having been accumulated in the PDs between the clock times t2 and t5 in the respective pixels B1 and the like in the B pixel group are transferred to the gates of the amplifying transistors via the transfer transistors all at once.

Thereby, the drive unit 502 can control a period of accumulating electrical charges in the respective pixels B1 and the like in the B pixel group collectively so that the period is different from that for the respective pixels Gr1 and the like in the G pixel group. Also, electrical charges can be accumulated in a particular pixel group for an accumulation period that is different from an exposure period. How long an accumulation period is set for which pixel group may be determined based on an output for each piece of image information corresponding to a pixel group at the time when tentative imaging is performed before main imaging. For example, when the system control unit 501 determines that an image based on one piece of image information is darker than an image based on another piece of image information, the system control unit 501 may cause an accumulation period for a pixel group corresponding to the one piece of image information to be longer than that for other pixel groups by using the drive unit 502.

At a clock time t8 later than the above-described clock time t7, the drive unit 502 turns on the selecting transistor of the pixel Gr1 in the G pixel group via the selecting interconnection 318. Thereby, pixel signals according to the electrical charges transferred by the transfer transistors are generated by the amplifying transistors, and the pixel signals are output to the G output interconnection 320 via the selecting transistors. At a clock time t9 later than the clock time t8, the drive unit 502 turns on the selecting transistor of the pixel Gr2 in the G pixel group via the selecting interconnection 318 to similarly output a pixel signal of the pixel Gr2 to the G output interconnection 320 via the selecting transistor. In this manner, the drive unit 502 sequentially turns on the selecting transistors via the selecting interconnections 318 and the like of the respective pixels Gr1 and the like in the G pixel group to sequentially cause the pixel signals of the respective pixels Gr1 and the like in the G pixel group to be output to the one G output interconnection 320.

In synchronization with the above-described clock times t8, t9, the drive unit 502 sequentially turns on the selecting transistors of the pixels R1 and the like in the R pixel group via the selecting interconnections 318 and the like to sequentially cause pixel signals of the respective pixels R1 and the like in the R pixel group to be output to the one R output interconnection 322. Similarly, in synchronization with the above-described clock times t8, t9, the drive unit 502 sequentially turns on the selecting transistors of the pixels B1 and the like in the B pixel group via the selecting interconnections 318 and the like to sequentially cause pixel signals of the respective pixels B1 and the like in the B pixel group to be output to the one B output interconnection 324.

In the above-described manner, a pixel signal of each pixel included in the unit group 131 is output from the output interconnection of each pixel group. Note that preferably an order of pixels to output pixel signals are predetermined within a pixel group, and incorporated as hardware or stored as software in the drive unit 502.

As described above, according to the present embodiment, a period of accumulating electrical charges in the respective pixels belonging to each pixel group corresponding to each piece of image information can be controlled collectively. Therefore, electrical charges can be accumulated for an accumulation period that is suitable for each piece of image information. For example, when a subject lopsided toward any of RGB is imaged, the dynamic ranges of respective colors can be widened by differentiating accumulation periods of a pixel group corresponding to a strong color and a pixel group corresponding to a weak color. Also, a pixel signal of each pixel can be read out independently of other pixel groups.

Figure 8:
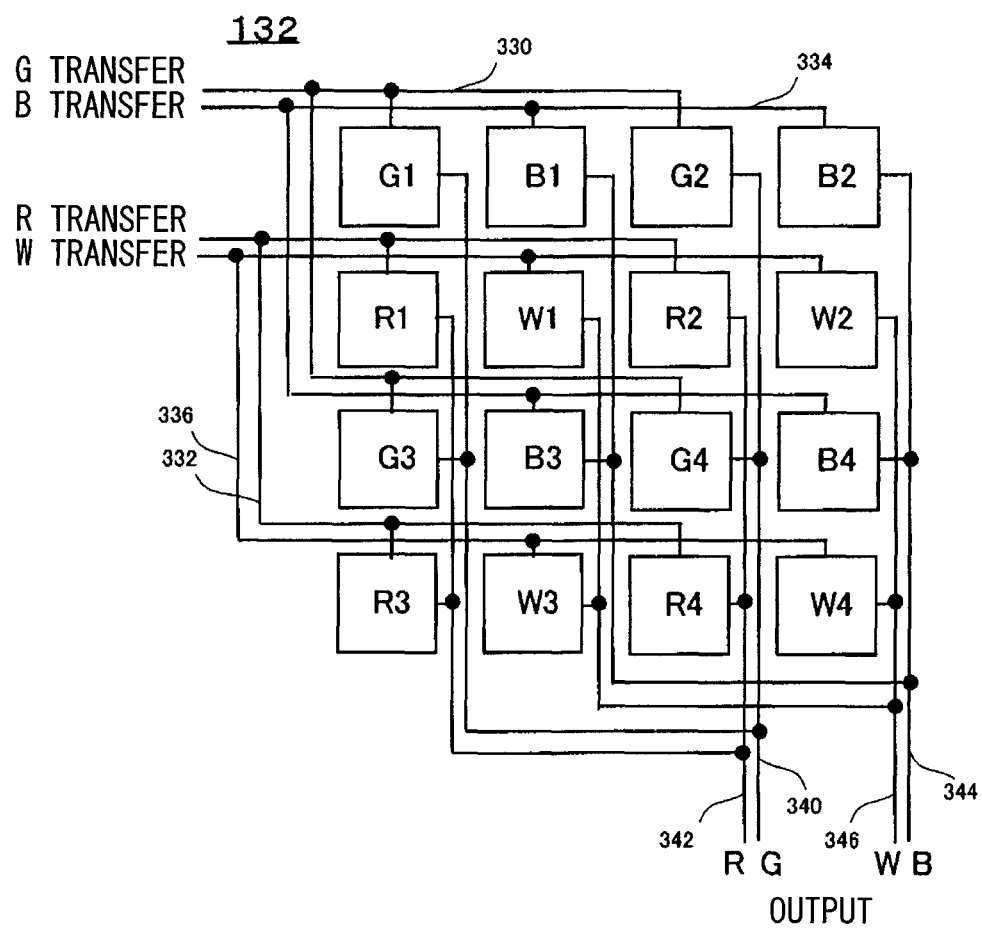
FIG. 8 shows an example of another unit group and a relationship of connections between pixels.

FIG. 8 shows an example of another unit group 132 and a relationship of connections between pixels. Note that, in FIG. 8, although transfer interconnections and output interconnections are indicated, each pixel is indicated with a square by omitting other configurations, for the purpose of making it easy to see the figure.

In the example illustrated in FIG. 8, white pixels W are disposed in a pixel array of the imaging element 100, in place of the green pixel Gb in FIG. 2. The corresponding color filters 102 are not provided, or colorless filters that allow passage of red, green, and blue are provided in the white pixels W. Thereby, incident light corresponding to color information which is one example of mutually different image information is incident on the green pixel Gb, the blue pixel B, the red pixel R, and the white pixel W.

The unit group 132 each has 4×4, 16, pixels. Note that the number of pixels included in the respective unit groups 132 is not limited thereto, as in the example of FIG. 4.

The pixels 150 having the color filters 102 of the same color form a pixel group within the unit group 132. Corresponding to the fact that there are four types, RGBW, of the color filters 102, four pixels, pixels G1, G2, G3, G4, form a G pixel group. Similarly, four pixels, pixels R1, R2, R3, R4, form an R pixel group, and four pixels, pixels B1, B2, B3, B4, form a B pixel group. Furthermore, four pixels, pixels W1, W2, W3, W4, form a W pixel group. That is, a pixel group is formed for each wavelength range that is transmitted through the color filters 102.

Here, the gates of transfer transistors of a plurality of pixels included in each pixel group share a connection. Thereby, the drive unit 502 controls the gates of the transfer transistors in the pixel group all at once, and independently of other pixel groups.

The gates of transfer transistors of the pixels G1, G2, G3, G4 included in the G pixel group are connected with a common G transfer interconnection 330. Similarly, the gates of transfer transistors of the pixels R1, R2, R3, R4 in the R pixel group are connected with a common R transfer interconnection 332, and the gates of transfer transistors of the pixels B1, B2, B3, B4 in the B pixel group are connected with a common B transfer interconnection 334. Furthermore, the gates of transfer transistors of the pixels W1, W2, W3, W4 in the W pixel group are connected with a common W transfer interconnection 336.

Also, the output sides of selecting transistors of a plurality of pixels included in each pixel group share a connection. The output sides of selecting transistors of the pixels G1, G2, G3, G4 in the G pixel group are connected with a common G output interconnection 340. Similarly, the output sides of selecting transistors of the pixels R1, R2, R3, R4 in the R pixel group are connected with a common R output interconnection 342, and the sources of selecting transistors of the pixels B1, B2, B3, B4 in the B pixel group are connected with a common B output interconnection 344. Furthermore, the output sides of selecting transistors of the pixels W1, W2, W3, W4 in the W pixel group are connected with a common W output interconnection 346.

Note that, as in the example of FIG. 4, a reset interconnection and a power supply interconnection are shared within the unit group 132. Also, there are 16 selecting interconnections each of which are disposed for each pixel and connected with the gate of a corresponding selecting transistor. Furthermore, as in the example of FIG. 4, a load current source is connected with each output interconnection.

Thereby, the drive unit 502 can control a period of accumulating electrical charges in the respective pixels belonging to each pixel group collectively. Also, electrical charges can be accumulated in a particular pixel group for an accumulation period that is different from that of other pixel groups. For example, because color filters in the W pixel group are colorless, the light amount may be larger than those for the G pixel group and the like. Accordingly, by making a period of accumulating electrical charges in the respective pixels of the W pixel group shorter than the period of accumulating electrical charges in the respective pixels in the G pixel group and the like, respectively appropriate exposure can be attained for the W pixel group and the G pixel group and the like.

Figure 9:
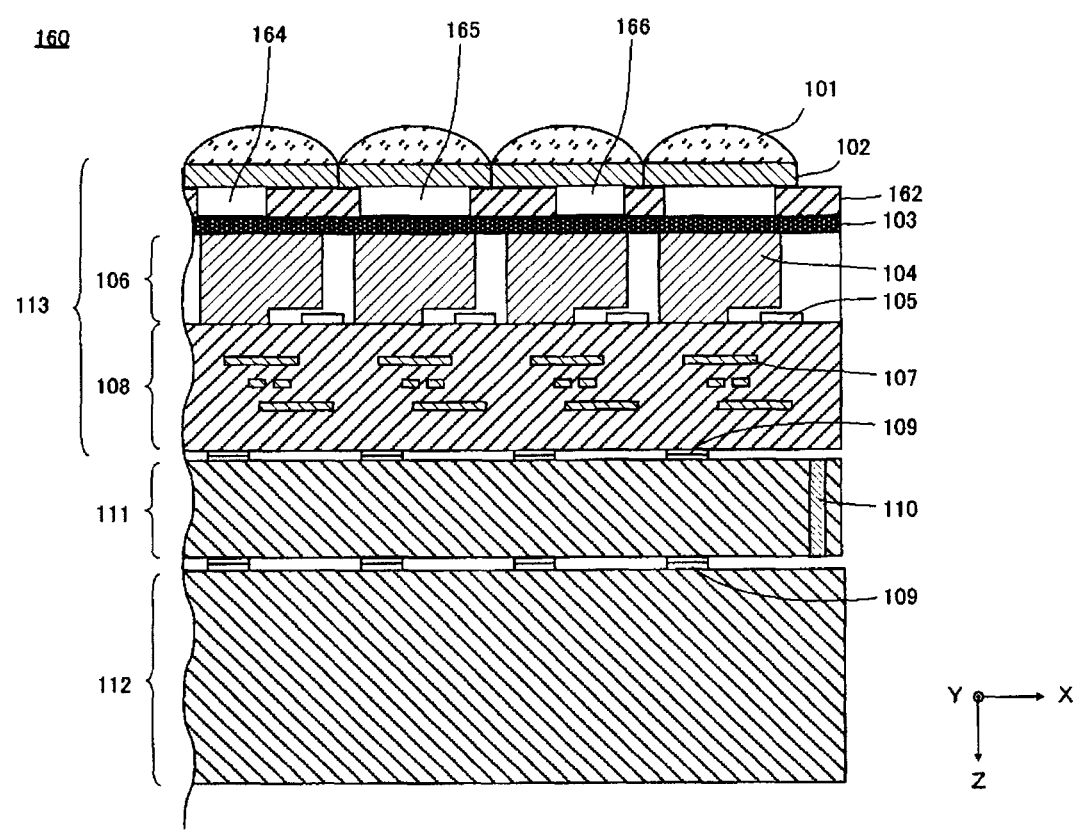
FIG. 9 is a sectional view of another backside irradiating type imaging element.

FIG. 9 is a sectional view of another backside irradiating type imaging element 160. Configurations of the imaging element 160 that are the same with those of the imaging element 100 in FIG. 1 are given the same reference numbers, and explanation thereof is omitted.

The imaging element 160 in FIG. 9 has an opening mask 162 between the passivation film 103 and the color filters 102. The opening mask 162 is formed for example with an aluminum film.

The opening mask 162 has openings 164, 165, 166 corresponding to the respective PDs 104, and portions other than the openings block incident light. Thereby, the opening mask 162 allows passage of a part of a luminous flux in an imaging optics depending on opening positions. The opening 164 that corresponds to a pixel disposed farthest in the X axis negative direction among four pixels illustrated in the example shown in FIG. 9 is displaced toward the X axis negative direction in relation to the PD 104. On the other hand, the opening 166 that corresponds to a pixel third farthest in the X axis negative direction among the four pixels is displaced toward the X axis positive direction in relation to the PD 104. Thereby, it is possible to cause a luminous flux that is displaced in the X axis negative or positive direction of the exit pupil of the imaging optics to be incident, and acquire information of phase differences AF.

Pixels in which these openings are displaced in relation to the PDs 104 are sometimes called parallax pixels. On the other hand, the opening 165 is not displaced in relation to the PD 104. The white color filters 102 are disposed in the parallax pixels. These pixels are sometimes called non-parallax pixels. The color filters 102 of any of RGB are disposed in the non-parallax pixels.

Figure 10:
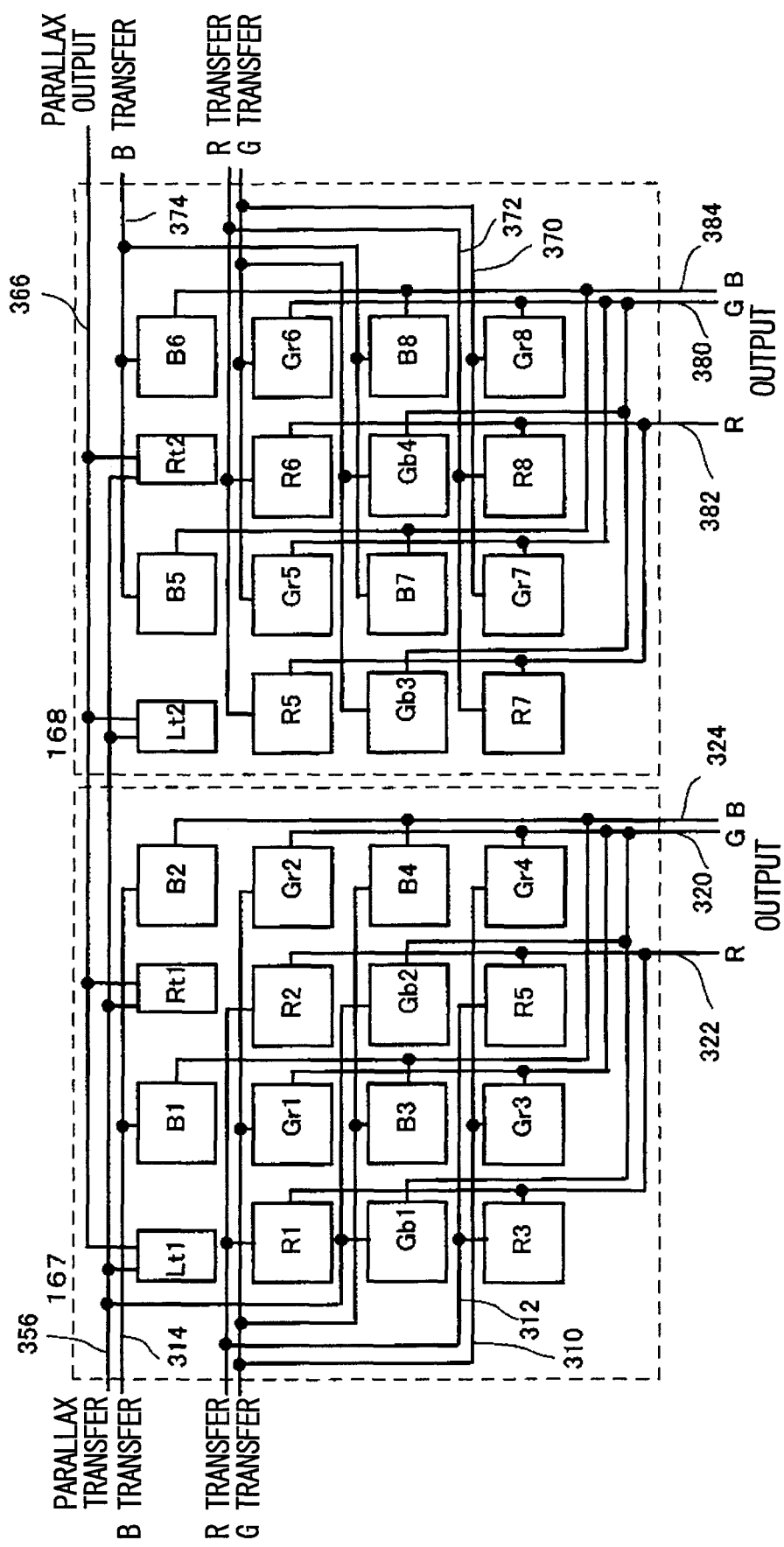
FIG. 10 shows an example of a unit group corresponding to the imaging element in FIG. 9 and a relationship of connections between pixels.

FIG. 10 shows an example of unit groups 167, 168 corresponding to the imaging element 160, and a relationship of connections between pixels. Note that, in FIG. 10, although transfer interconnections and output interconnections are indicated, each pixel is indicated with a square by omitting other configurations, for the purpose of making it easy to see the figure, as in FIG. 8.

In the example illustrated in FIG. 10, parallax pixels Lt1, Rt1 are disposed in a 4×4 pixel array of the imaging element 160, in place of the green pixels Gr1, Gr2 in FIG. 4. The parallax pixel Lt1 corresponds to the pixel in FIG. 9 in which the opening 164 is provided, and the parallax pixel Rt1 corresponds to the pixel in FIG. 9 in which the opening 166 is provided. Also, the 4×4, 16, pixels form a unit group 167.

The pixels 150 having the color filters 102 of the same color form a pixel group within the unit group 167. Corresponding to the fact that there are three types, RGB, of the color filters 102, the G pixel group, the R pixel group, and the B pixel group are formed, as in FIG. 4. Because configurations and actions of the G pixel group, the R pixel group, and the B pixel group are similar to those in FIG. 4, explanation thereof is omitted. Note that however that, corresponding to the fact that the parallax pixels Lt1, Rt1 are disposed in the unit group 167, in place of the green pixels Gr1, Gr2 in FIG. 4, the G pixel group is formed with six pixels. Note that, although a G transfer interconnection 370, an R transfer interconnection 372, a B transfer interconnection 374, a G output interconnection 380, an R output interconnection 382, and a B output interconnection 384 that are separate from the unit group 167 are provided to the unit group 168, their connection relationship is similar to that for the unit group 167.

Furthermore, a pixel group is also formed for each opening position. In this case, a pixel group is formed astride a plurality of the unit groups 167, 168. In the example shown in FIG. 10, four pixels, parallax pixels Lt1, Lt2, Rt1, Rt2 whose opening positions are displaced, form a parallax pixel group.

The gates of transfer transistors of the parallax pixels Lt1, Lt2, Rt1, Rt2 included in the parallax pixel group are connected with a common parallax transfer interconnection 356. Also, the output sides of the selecting transistors of the pixels Lt1, Lt2, Rt1, Rt2 in the parallax pixel group are connected with a common parallax output interconnection 366.

Thereby, the drive unit 502 can control a period of accumulating electrical charges in the respective pixels belonging to each pixel group collectively. Also, electrical charges can be accumulated in a particular pixel group for an accumulation period that is different from that of other pixel groups. Furthermore, as in the example of FIG. 4, a load current source is connected with each output interconnection.

For example, when a release button of the imaging device 500 is half-pressed, the respective pixels Lt1 and the like in the parallax pixel group are driven to acquire information of the phase differences AF, and also at this time point, the respective pixels Gr1 and the like of the other pixel groups are not driven. On the other hand, when the release button of the imaging device 500 is fully pressed, the respective pixels Gr1 and the like in the G pixel group, the R pixel group, and the B pixel group are driven to acquire information of RGB images, and also the respective pixels Lt1 and the like in the parallax pixel group are not driven. Thereby, in a state where the release button is half-pressed, electrical charges can be accumulated for an accumulation period suitable for information of the phase differences AF, and also information of the phase differences AF can be obtained in a shorter period of time by performing image processing with less pixels. On the other hand, in a state where the release button is fully pressed, electrical charges can be accumulated for an accumulation period that is suitable for information of RGB images while maintaining a high resolution.

Note that although, in FIG. 10, the parallax pixel group is formed astride two unit groups 167, 168, the parallax pixel group may be formed by parallax pixels within a unit group or astride three or more unit groups. Furthermore, the parallax pixel group may be formed for each displacement direction of opening positions. That is, a parallax pixel group of a plurality of the pixels Lt1, Lt2, and the like whose openings are displaced in the X axis negative direction, and a parallax pixel group of a plurality of the pixels Rt1, Rt2, and the like whose openings are displaced in the X axis positive direction may be formed.

Also, in the array of FIG. 4 or 8, each pixel may have a displaced opening. In this case, a pixel group may be formed for each color and each displacement direction of opening positions. Furthermore, instead of or in addition to the parallax pixels in FIG. 10, a pixel that has a non-displaced opening and to which the color filter 102 is not provided or which has the colorless color filter 102 may be disposed as an AE pixel within the unit groups 167, 168. In this case also, a plurality of AE pixels form an AE pixel group so that the drive unit 502 controls a period of accumulating electrical charges in the respective pixels belonging to the AE pixel group collectively. Thereby, it is possible to set an accumulation period that is suitable for obtaining exposure information as image information, and read out pixel information independently of the other pixel groups for example at the time when the release button is half-pressed.

Figure 11:
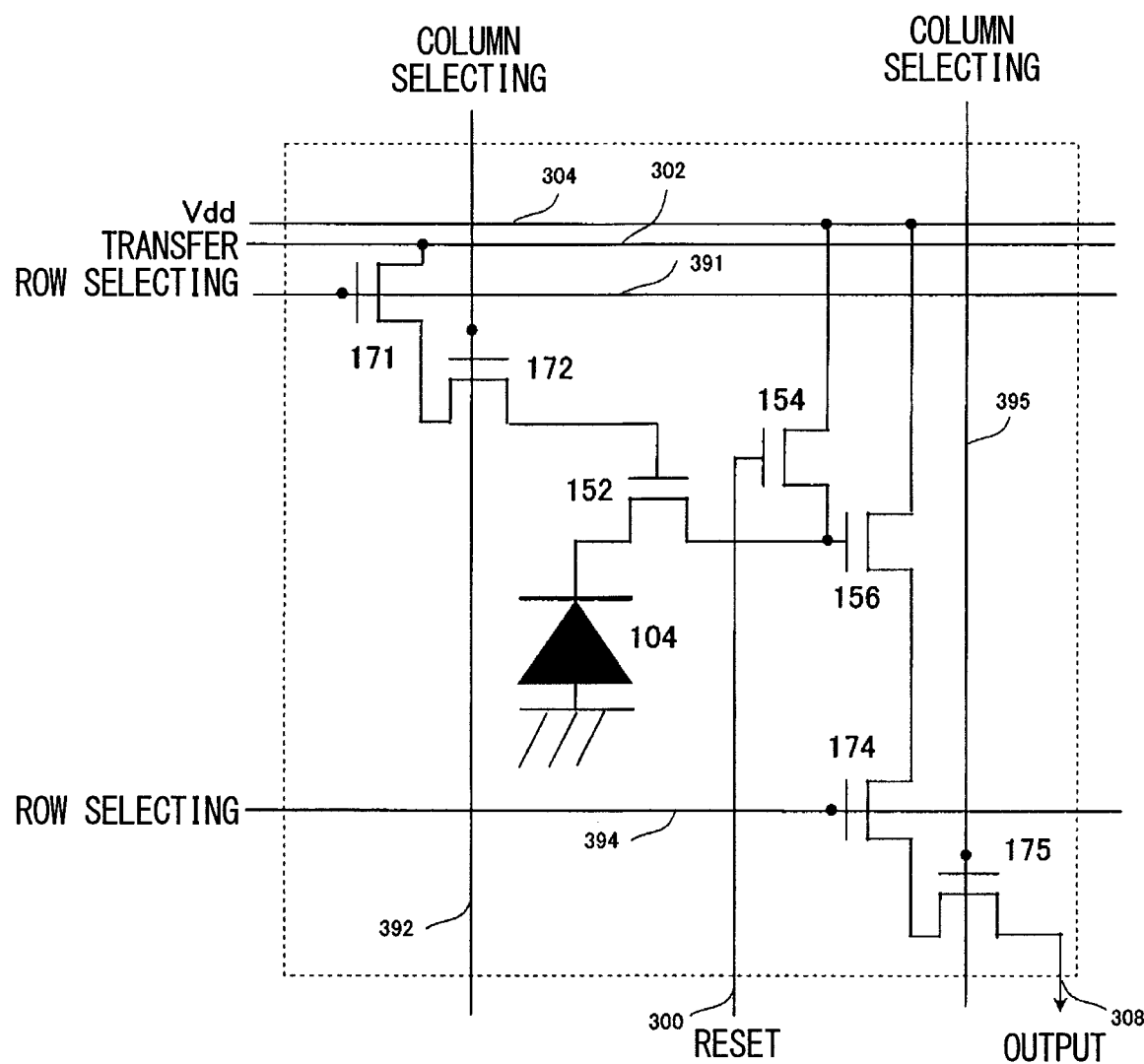
FIG. 11 shows another equivalent circuit of a pixel.

FIG. 11 illustrates an equivalent circuit of another pixel 170. Configurations in FIG. 11 that are the same with those of the pixel 150 in FIG. 3 are given the same reference numbers, and explanation thereof is omitted. Note that although, as in the example of FIG. 4, a load current source is connected with the output interconnection 308, illustration thereof is omitted.

In the pixel 170, a row selecting transistor 171 and a column selecting transistor 172 are provided between the transfer interconnection 302 and the gate of the transfer transistor 152. The gate of the row selecting transistor 171 is connected with a row selecting interconnection 391, and the gate of the column selecting transistor 172 is connected with a column selecting interconnection 392. For example, the gates of row selecting transistors of pixels that are lined up in the X direction (that is, the row direction) with the pixel 170 at least within the unit group 131 are disposed in common to the row selecting interconnection 391. Similarly, the gates of column selecting transistors of pixels that are lined up in the Y direction (that is, the column direction) with the pixel 170 at least within the unit group 131 are disposed in common to the column selecting interconnection 392.

According to the above-described configuration, the transfer transistor 152 of the pixel 170 that is specified by the row selecting interconnection 391 and the column selecting interconnection 392 when an ON signal is provided to the interconnections can be turned on. Thereby, ON/OFF of transfer transistors can be controlled on a pixel-by-pixel basis.

Furthermore, in place of the single selecting transistor 158 of the pixel 150, a row selecting transistor 174 and a column selecting transistor 175 are provided to the pixel 170. The gate of the row selecting transistor 174 is connected with a row selecting interconnection 394, and the gate of the column selecting transistor 175 is connected with a column selecting interconnection 395. For example, the gates of row selecting transistors of pixels that are lined up in the X direction (that is, the row direction) with the pixel 170 at least within the unit group 131 are disposed in common to the row selecting interconnection 394. Similarly, the gates of column selecting transistors of pixels that are lined up in the Y direction (that is, the column direction) with the pixel 170 at least within the unit group 131 are disposed in common to the column selecting interconnection 395.

According to the above-described configuration, a pixel signal of the pixel 170 that is specified by the row selecting interconnection 394 and the column selecting interconnection 395 when an ON signal is added to the interconnections can be output to the output interconnection 308. Thereby, the number of interconnections can be reduced as compared with the selecting interconnections 318 that correspond to the selecting transistors 158 on a one-to-one basis as in the pixel 150.

Note that the row selecting interconnection 391 and the column selecting interconnection 392 for the transfer transistor 152, and the row selecting interconnection 394 and the column selecting interconnection 395 for the output interconnection 308 may not be used in pairs. The configurations of the pixel 150 may be used for either of them. Also, when transfer and output are never performed simultaneously, the row selecting interconnections 391, 394 may be a single interconnection to be used in common for transfer and output, and the column selecting interconnections 392, 395 may be a single interconnection to be used in common for transfer and output.

In any of the above-described embodiments, the reset interconnection 326 and the power supply interconnection 316 are shared within the unit group 131. In addition to this, the reset interconnection 326 and the power supply interconnection 316 may be shared among a plurality of the unit groups 131. Also, instead of this, the reset interconnection 326 may be an interconnection which is shared within each pixel group, and separate among pixel groups. Furthermore, the reset interconnection 326 may be a separate interconnection for each pixel, and the reset transistor 154 may be controlled similar to control of the transfer transistor 152 in the pixel 170.

As described above, according to the present embodiments, an electrical charge accumulation period and readout are controlled by handling a plurality of pixels that correspond to the same image information as a pixel group, within the unit group 131 or among the unit groups 131. Accordingly, an electrical charge accumulation period and readout timing suitable for each piece of image information can be set.

Figure 12:
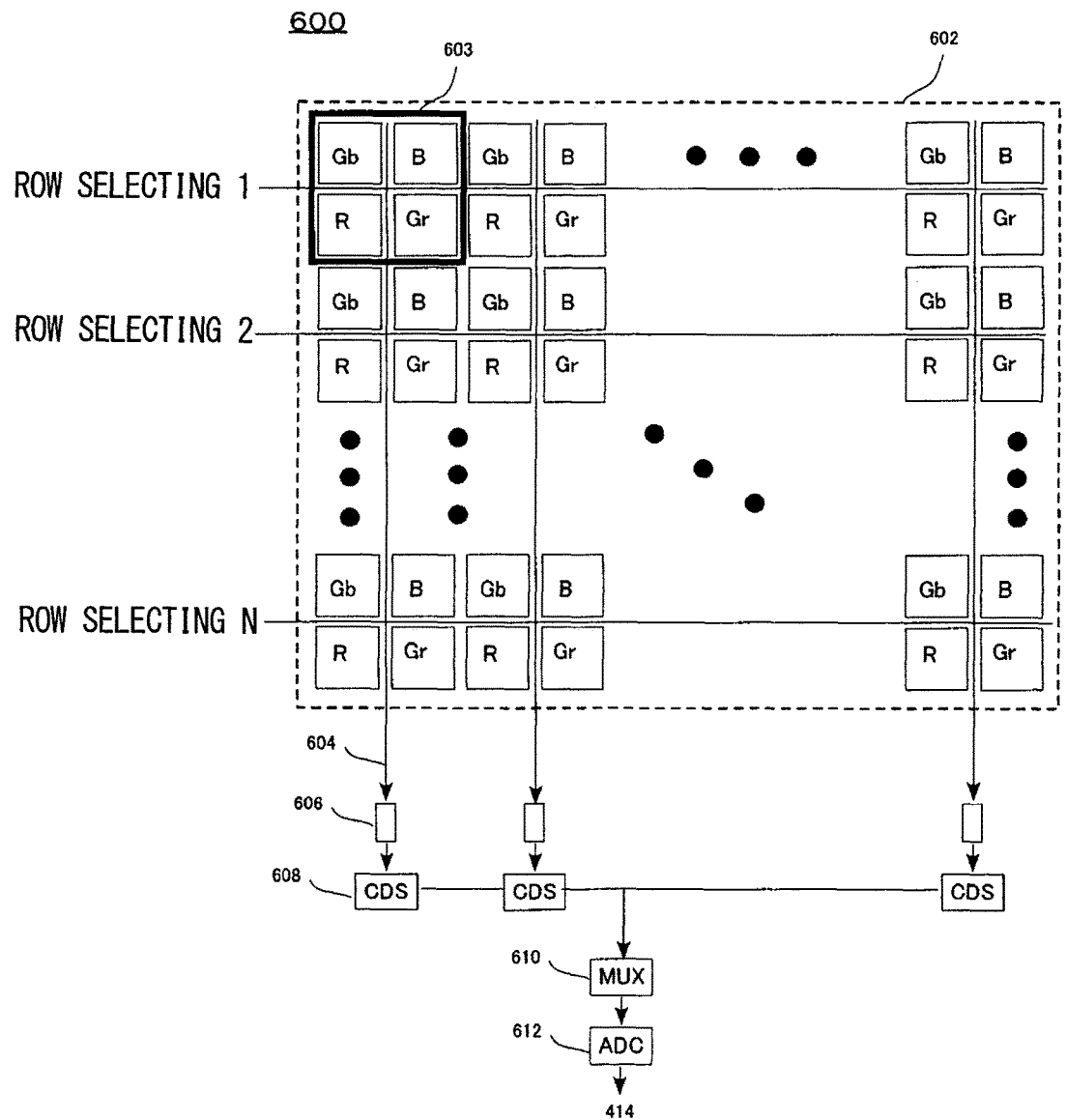
FIG. 12 schematically shows another unit group of an imaging element.
Figure 13:
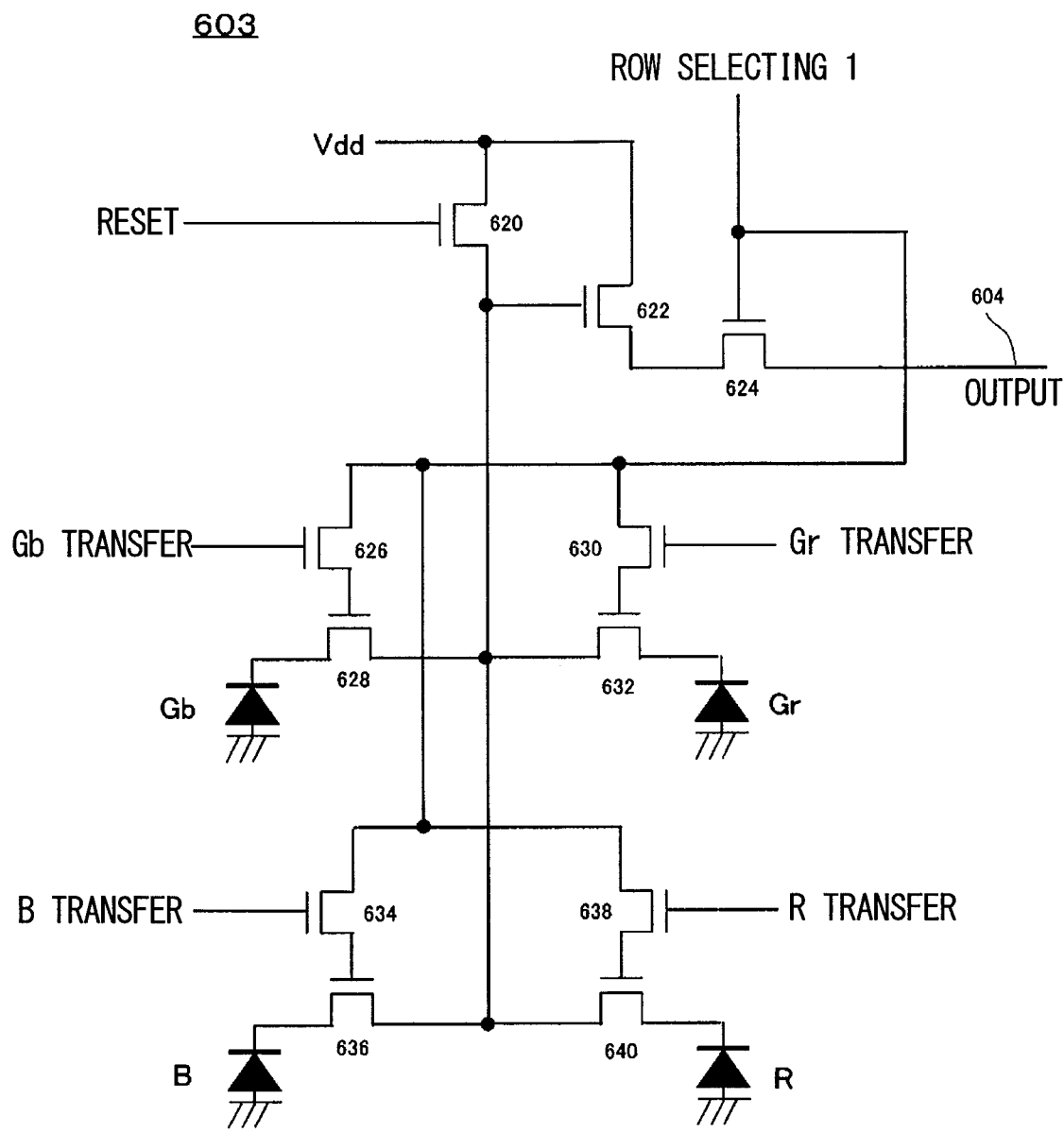
FIG. 13 shows a schematic of a pixel unit in a unit group.

FIG. 12 schematically illustrates a unit group 602 of another imaging element 600. FIG. 13 illustrates a schematic of a pixel unit 603 within the unit group 602.

In the unit group 602 of the imaging element 600, pixels are arrayed in Bayer arrays two-dimensionally as in FIG. 2. A row selecting line is provided to every two rows of pixels, and two rows of pixels are connected in common to each row selecting line. An output interconnection 604 is provided to every two columns of pixels, and two columns of pixels are connected in common to each output interconnection 604. Each of the output interconnections 604 is connected on a one-to-one basis with a CDS circuit 608 via a bump 606 that electrically connects the imaging chip 113 and the signal processing chip 111.

Outputs of a plurality of CDS circuits 608 that are each connected on a one-to-one basis with each of a plurality of the output interconnections 604 included in the unit group 602 are input to a multiplexer 610. Furthermore, an output from the multiplexer 610 is input to an A/D converting circuit 612, and an output of the A/D converting circuit 612 is connected with the pixel memories 414.

Also, one unit in a Bayer array forms the pixel unit 603. That is, the pixel unit 603 has four pixels Gb, Gr, B, R.

The power supply interconnection Vdd and a reset interconnection are connected in common to all the pixels included in the unit group 131. Also, a Gb transfer interconnection is connected in common to pixels Gb in the unit group 131. Similarly, a Gr transfer interconnection is connected in common to pixels Gr in the unit group 131, a B transfer interconnection is connected in common to pixels B in the unit group 131, and an R transfer interconnection is connected in common to pixels R in the unit group 131. Furthermore, the reset interconnection and each transfer interconnection are provided separately among a plurality of the unit groups 131.

The pixels Gb, Gr, B, R of the pixel unit 603 share a reset transistor 620, an amplifying transistor 622, and a selecting transistor 624. Also, the pixel Gb1 has transfer transistors 626, 628. Similarly, the pixel Gr has transfer transistors 630, 632, the pixel B has transfer transistors 634, 636, and the pixel R has transfer transistors 638, 640.

When paying attention to each pixel, a relationship of connections among the pixel, and the reset transistor 620, the amplifying transistor 622, and the selecting transistor 624 is the same with that in FIG. 3. On the other hand, the transfer transistors 626 and the like have a connection relationship different from that in FIG. 3. The gate, drain, and source of the transfer transistor 626 of the pixel Gb are connected with the Gb transfer interconnection, a row selecting line 1, and the gate of the transfer transistor 628, respectively. Also, the source and drain of the transfer transistor 628 are connected with one end of the PD of the pixel Gb, and the gate of the amplifying transistor 622, respectively. The connection relationship of the pixels Gr, B, R is similar.

In the embodiments shown in FIGS. 12 and 13, an image signal of each pixel is read out as described below. Note that explanation of a reset operation is omitted to simplify the explanation.

One row selecting line, for example the row selecting line 1, is turned on. In this state, one transfer interconnection, for example the Gb transfer interconnection is turned on. Thereby, both the transfer transistors 626, 628 of the pixel Gb are turned on, and electrical charges in the pixel Gb are transferred to the gate of the amplifying transistor 622. Here, because the row selecting line 1 is in an ON state, the selecting transistor 624 has also been turned on, and a pixel signal that has been amplified according to the electrical charges transferred to the gate of the amplifying transistor 622 is output from the output interconnection 604.

Because the row selecting line 1 is shared by two rows of pixels within the unit group 602, and the Gb transfer interconnection is shared by the pixels Gb within the unit group 602, pixel signals of a single row of the pixels Gb in the unit group 602 are output simultaneously to respectively corresponding ones of the output interconnections 604. Here, because the CDS circuits 608 are each disposed on a one-to-one basis with each of the output interconnections 604, pixel signals are retained, in a state where noises are removed therefrom, temporarily in the respective CDS circuits 608.

The multiplexer 610 reads out pixel signals retained in the CDS circuits 608 sequentially, and passes them over to the A/D converting circuit 612. The A/D converting circuit 612 digitizes the pixel signals sequentially, and writes them into the pixel memories 414. Thereby, each of the pixel signals of one row of the pixels Gb in the unit group 602 is stored in the pixel memories 414 without being influenced by other pixel signals.

Next, by turning on the Gr transfer interconnection in a state where the row selecting line 1 is turned on, each of the pixel signals of one row of the pixels Gr in the unit group 602 is read out sequentially without being influenced by other pixel signals. Similarly, by turning on the B transfer interconnection in a state where the row selecting line 1 is turned on, each of the pixel signals of one row of the pixels B in the unit group 602 is read out, and stored in the pixel memories 414, and by turning on the R transfer interconnection in a state where the row selecting line 1 is turned on, each of the pixel signals of one row of the pixels R in the unit group 602 is read out, and stored in the pixel memories 414. In the above-described manner, the pixel signals of two rows of the pixels in the unit group 602 are read out.

Next, by turning on a row selecting line 2 and repeating the above-described procedure, pixel signals of next two row of pixels in the unit group 602 are read out. By repeating the above-described procedure for all the row selecting lines, pixel signals of all the pixels in the unit group 602 are read out.

According to the embodiments in FIGS. 12 and 13, because only one row selecting line has to be provided to two rows of pixels in each unit group 602, interconnections can be routed easily. Also, because only one output interconnection has to be provided to two columns of pixels in each unit group 602, interconnections can be routed easily.

Figure 14:
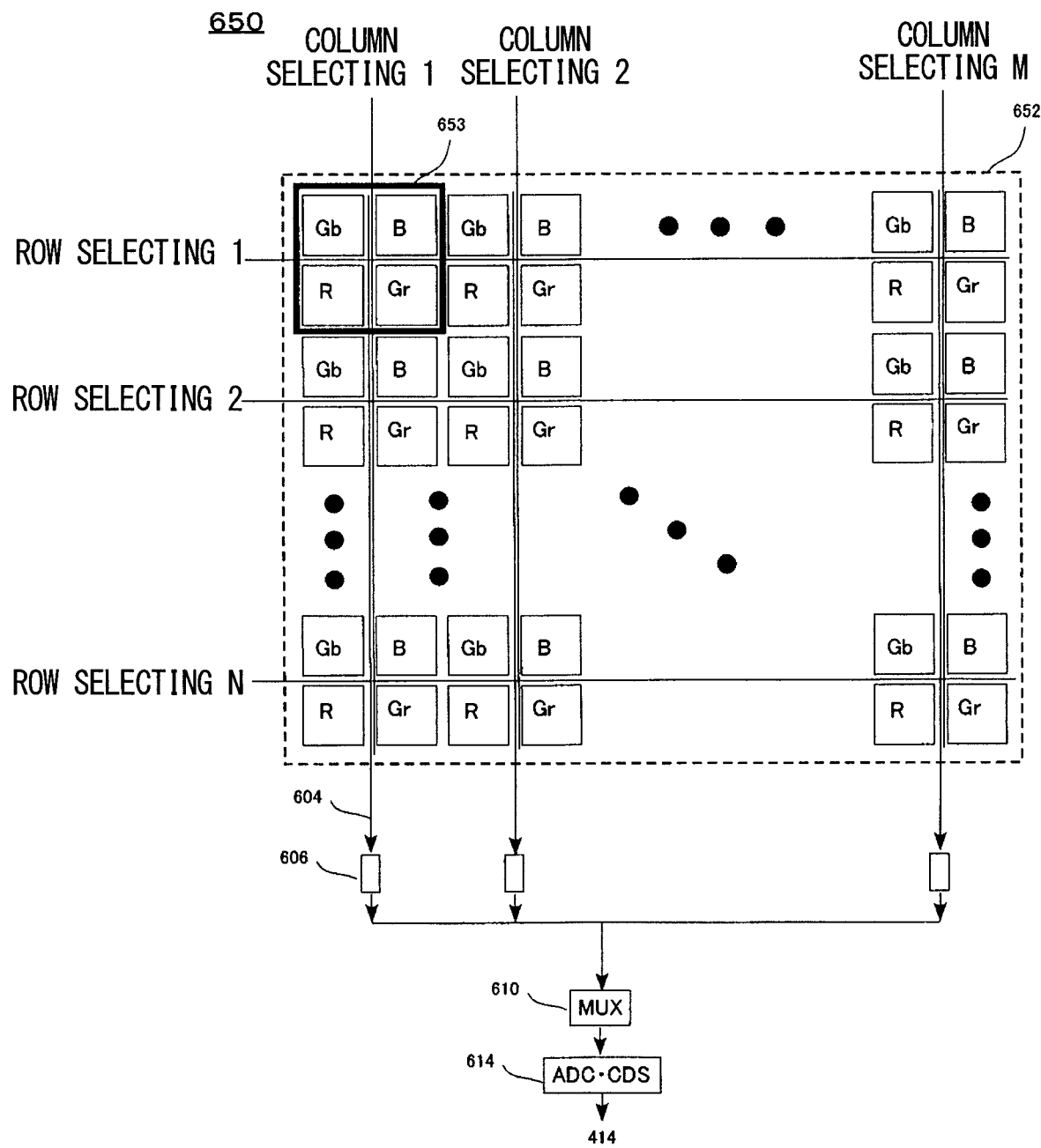
FIG. 14 schematically shows still another unit group of an imaging element.
Figure 15:
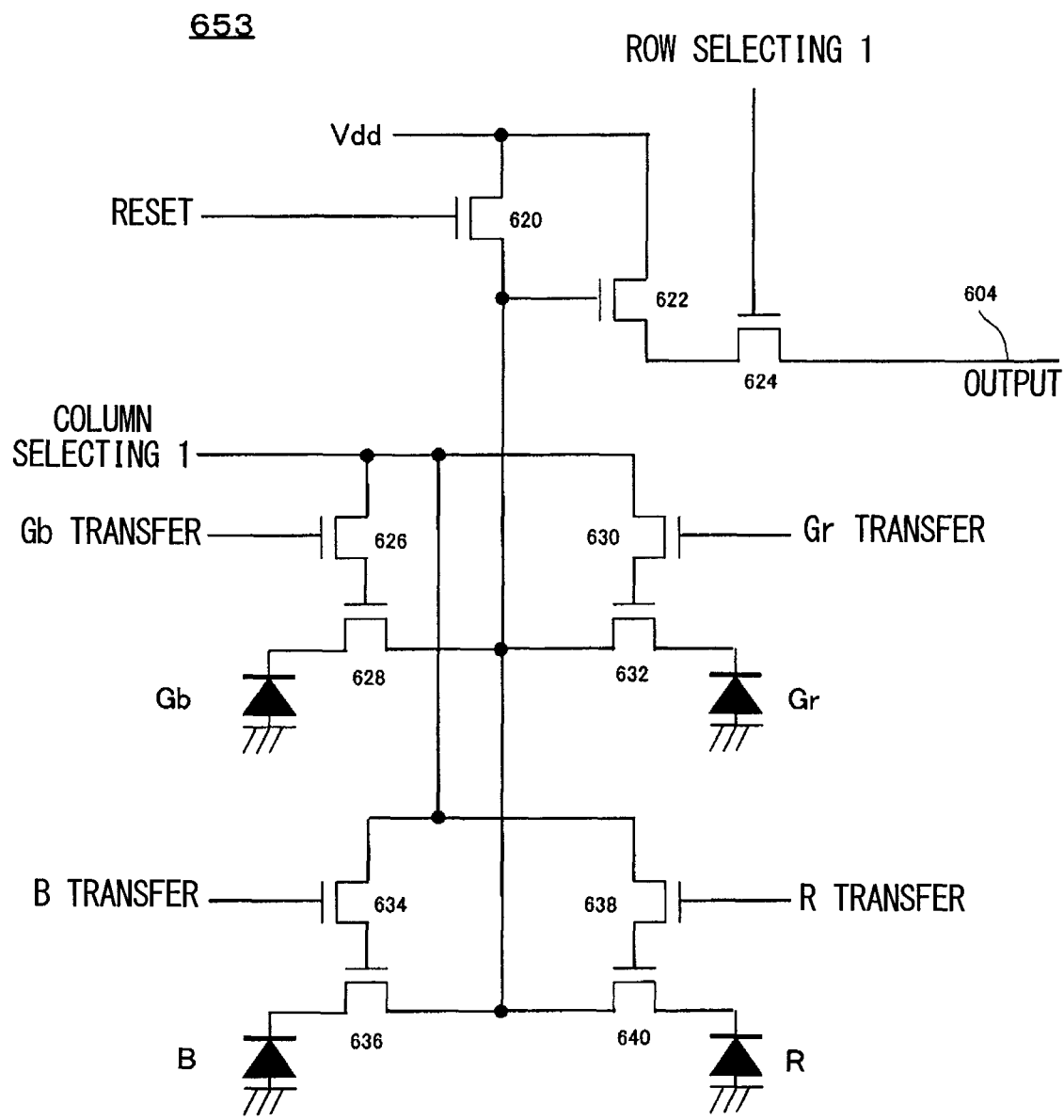
FIG. 15 shows a schematic of a pixel unit in a unit group.

FIG. 14 schematically illustrates a unit group 652 of still another imaging element 650. FIG. 15 illustrates a schematic of a pixel unit 653 within the unit group 652. Configurations and functions in FIGS. 14 and 15 that are the same with those in FIGS. 12 and 13 are given the same reference numbers, and explanation thereof is omitted.

In the unit group 652, one column selecting line is provided to two columns of pixels, and two columns of pixels are connected in common to each column selecting line. The column selecting line is connected with the drain of each of the transfer transistors 626, 630, 634, 638 of the pixel unit 653.

The respective output interconnections 604 are disposed in the signal processing chip 111 via the bumps 606, and are input to the one multiplexer 610 provided corresponding to the unit group 652. Output of the multiplexer 610 is input to the A/D converting circuit 614. The A/D converting circuit 614 has a circuit that executes CDS digitally, in addition to a circuit that digitizes pixel signals. Output that have been digitized and subjected to CDS by the A/D converting circuit 614 are stored in the pixel memories 414.

In the embodiments of FIGS. 14 and 15, an image signal of each pixel is read out as described below. Note that explanation of a reset operation is omitted in order to simplify explanation.

One row selecting line, for example the row selecting line 1, is turned on. In this state, one transfer interconnection, for example the Gb transfer interconnection is turned on. Still in this state, one column selecting line, for example the column selecting line 1, is turned on. Thereby, both the transfer transistors 626, 628 of the pixel Gb of the pixel unit 653 in the unit group 652 are turned on, and electrical charges in the pixel Gb are transferred to the gate of the amplifying transistor 622. Here, because the row selecting line 1 is in an ON state, the selecting transistor 624 has also been turned on, and a pixel signal that has been amplified according to the electrical charges transferred to the gate of the amplifying transistor 622 is output from the output interconnection 604 corresponding to the pixel unit 653. Furthermore, by switching ON states of the column selecting lines sequentially while maintaining the ON states of the row selecting line 1 and the Gb transfer interconnection, pixel signals of one row of the pixels Gb are output sequentially from the respective output interconnections 604.

By switching, with the multiplexer 610, inputs from the respective output interconnections 604 in synchronization with switching of the column selecting lines, pixel signals from the pixels Gb are input to the A/D converting circuit 614 on a pixel-by-pixel basis. Each of the pixel signals of one row of the pixels Gb in the unit group 652 is read out and stored in the pixel memory 414 without being influenced by other pixel signals.

Next, by switching ON states of the column selecting lines sequentially in a state where the row selecting line 1 and the Gr transfer interconnection are turned on, pixel signals of one row of the pixels Gr are output sequentially from the respective output interconnections 604. Similarly, by switching ON states of the column selecting lines sequentially in a state where the row selecting line 1 and the B transfer interconnection are turned on, pixel signals of one row of the pixels B are output sequentially from the respective output interconnections 604, and by switching ON states of the column selecting lines sequentially in a state where the row selecting line 1 and the R transfer interconnection are turned on, pixel signals of one row of the pixels R are output sequentially from the respective output interconnections 604. In the above-described manner, the pixel signals of two rows of the pixels in the unit group 652 are read out.

Next, by turning on the row selecting line 2 and repeating the above-described procedure, pixel signals of next two rows of pixels in the unit group 652 are read out. By repeating the above-described procedure for all the row selecting lines, pixel signals of all the pixels in the unit group 652 are read out.

According to the embodiments in FIGS. 14 and 15 also, because only one row selecting line has to be provided to two rows of pixels in each unit group 652, interconnections can be routed easily. Also, because only one output interconnection has to be provided to two columns of pixels in each unit group 652, interconnections can be routed easily. Also, the CDS circuit can be provided on the signal processing chip 111 side.

Figure 16:
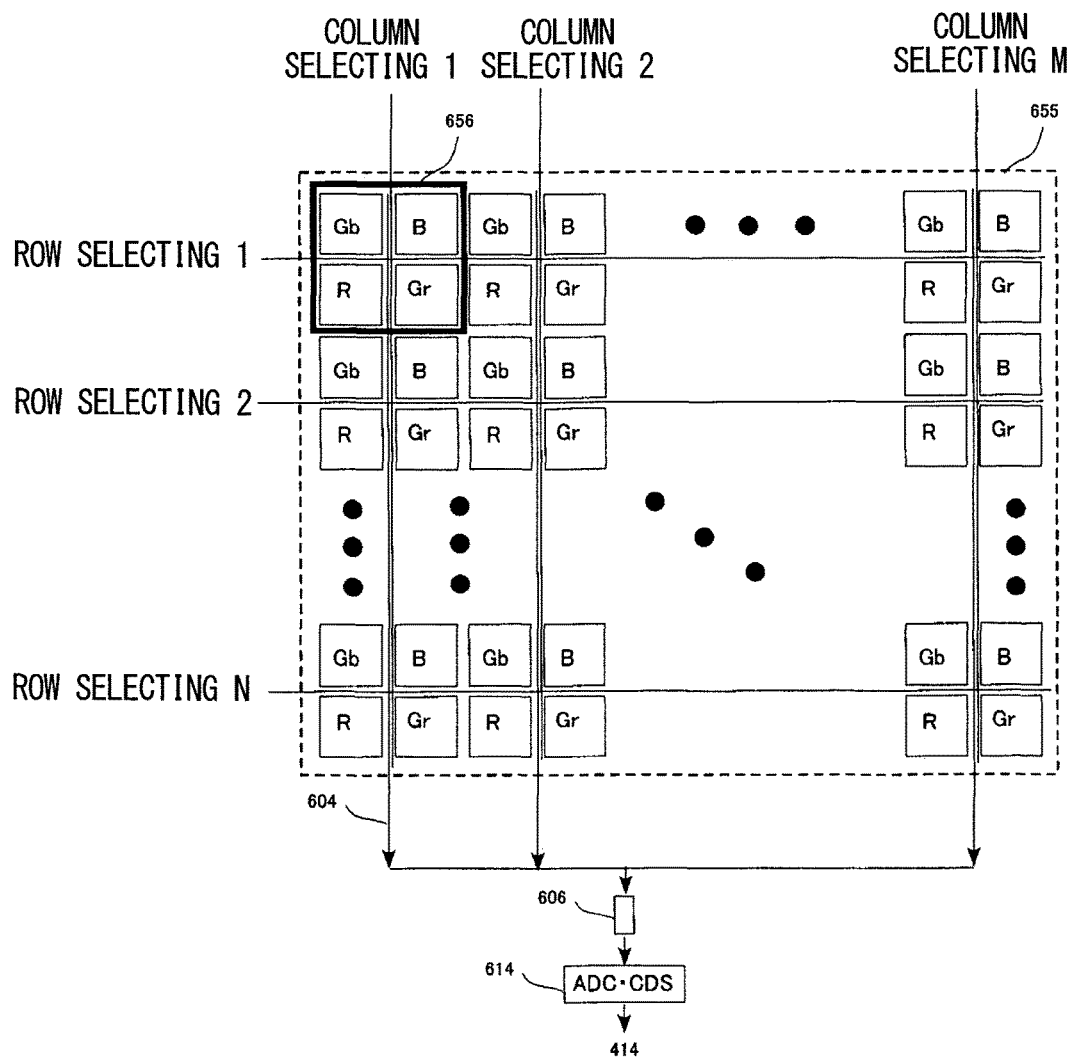
FIG. 16 schematically shows another unit group of an imaging element.
Figure 17:
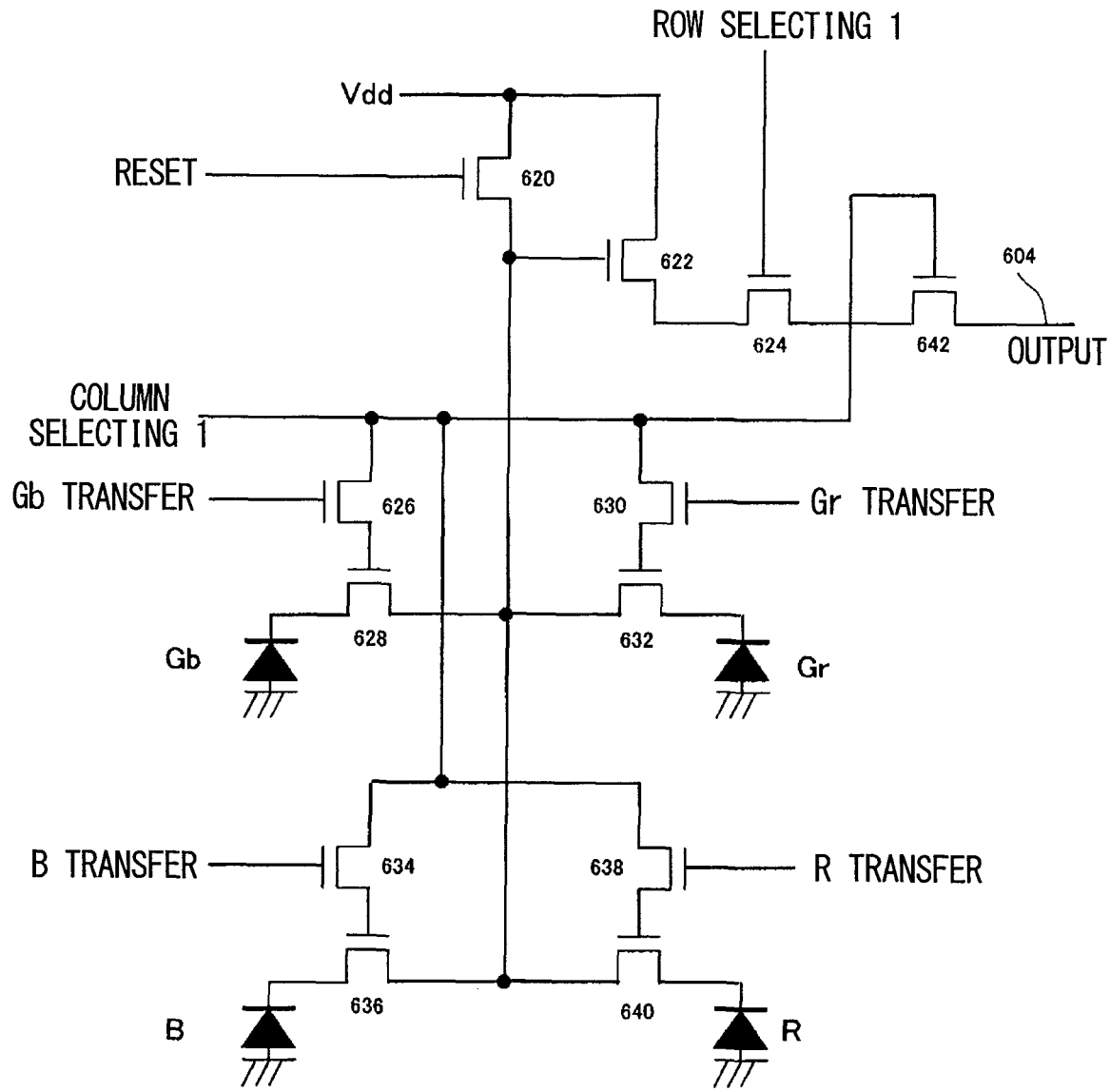
FIG. 17 shows a schematic of a pixel unit in a unit group.

FIG. 16 schematically illustrates a unit group 655 of still another imaging element 654. FIG. 17 illustrates a schematic of a pixel unit 656 within the unit group 655. Configurations and functions in FIGS. 16 and 17 that are the same with those in FIGS. 14 and 15 are given the same reference numbers, and explanation thereof is omitted.

In the unit group 655, a plurality of the output interconnections 604 are connected in common to the one bump 606 provided corresponding to the unit group 652. The bump 606 is connected with the input side of the A/D converting circuit 614. Also, a selecting transistor 642 whose gate is connected with a column selecting line is provided to the output interconnection 604 of the pixel unit 656.

In the embodiments of FIGS. 16 and 17, an image signal of each pixel is read out as described below. Note that explanation of a reset operation is omitted in order to simplify explanation.

One row selecting line, for example the row selecting line 1, is turned on. In this state, one transfer interconnection, for example the Gb transfer interconnection is turned on. Still in this state, one column selecting line, for example the column selecting line 1, is turned on. Thereby, both the transfer transistors 626, 628 of the pixel Gb of the pixel unit 656 in the unit group 655 are turned on, and electrical charges in the pixel Gb are transferred to the gate of the amplifying transistor 622. Here, because the row selecting line 1 is in an ON state, the selecting transistor 624 has also been turned on, and a pixel signal that has been amplified according to the electrical charges transferred to the gate of the amplifying transistor 622 is output from the output interconnection 604 corresponding to the pixel unit 653.

Furthermore, by switching ON states of the column selecting lines sequentially while maintaining the ON states of the row selecting line 1 and the Gb transfer interconnection, pixel signals of one row of the pixels Gb are output sequentially from the respective output interconnections 604. Accordingly, pixel signal from the pixels Gb are input to the A/D converting circuit 614 via the bump 606 on a one pixel-by-one pixel basis. In this case, because the selecting transistor 642 is disposed in the respective pixel unit 656, an output of the pixel Gb of the pixel unit 656 that is not selected by the column selecting line is blocked. Accordingly, each of the pixel signals of one row of the pixels Gb in the unit group 655 is read out and stored in the pixel memories 414 without being influenced by other pixel signals.

Next, by switching ON states of the column selecting lines sequentially in a state where the row selecting line 1 and the Gr transfer interconnection are turned on, pixel signals of one row of the pixels Gr are output sequentially from the respective output interconnections 604. Similarly, by switching ON states of the column selecting lines sequentially in a state where the row selecting line 1 and the B transfer interconnection are turned on, pixel signals of one row of the pixels B are output sequentially from the respective output interconnections 604, and by switching ON states of the column selecting lines sequentially in a state where the row selecting line 1 and the R transfer interconnection are turned on, pixel signals of one row of the pixels R are output sequentially from the respective output interconnections 604.

In the above-described manner, the pixel signals of two rows of the pixels in the unit group 655 are read out. Next, by turning on the row selecting line 2 and repeating the above-described procedure, pixel signals of next two rows of pixels in the unit group 655 are read out. By repeating the above-described procedure for all the row selecting lines, pixel signals of all the pixels in the unit group 655 are read out.

According to the embodiments in FIGS. 16 and 17 also, because only one row selecting line has to be provided to two rows of pixels in each unit group 655, interconnections can be routed easily. Also, because only one output interconnection has to be provided to two columns of pixels in each unit group 655, interconnections can be routed easily. Also, the CDS circuit can be provided on the signal processing chip 111 side. Furthermore, because a multiplexer may not be provided, interconnections on the signal processing chip 111 side can be simplified.

Although in the embodiments illustrated in FIGS. 12 to 17, the A/D converting circuits 612, 614 are provided on a one-to-one basis to the unit groups 602, 652, 655, the number of the A/D converting circuits 612, 614 is not limited to one. A plurality of the A/D converting circuits 612, 614 may be provided to each unit group 602, 652, 655. In this case, a plurality of the output interconnections 604 of each unit group 602, 652, 655 are respectively allocated to any of the plurality of A/D converting circuits 612, 614 and interconnected and input thereto.

Also, although a pixel unit consists of four pixels, a row selecting interconnection is disposed for every two rows of pixels, and an output interconnection is disposed for every three columns of pixels, these configurations are not essential. For example, when a pixel unit consists of m rows and n columns, in a unit group, a row selecting interconnection may be provided to every m rows, and an output interconnection may be provided to every n columns, and m×n separate transfer interconnections may be provided. Note that each transfer interconnection may be shared within a pixel group.

The imaging device 500 according to the above-described embodiments may be used to image still images or moving images. When imaging moving images, an accumulation period of each pixel group may be changed over time. For example, an accumulation period of each pixel group may be changed dynamically before and after a scene change. In this case, an accumulation period may be changed as in a case of still images based on an immediately previous image. Also, an accumulation period may be changed based on images that have been imaged over immediately preceding several seconds, for example based on a time average of the images. Also, an accumulation period may be changed according to a flow of imaging, by using a database in which a relationship between the flow of imaging and accumulation periods is preregistered.

Also, although the imaging chip 113, the signal processing chip 111, and the memory chip 112 are layered in the above-described embodiments, these may not be layered. That is, their functions may be provided in a single chip.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:
1. An image sensor comprising;
a plurality of pixels that each have a photoelectric conversion unit that converts light into an electrical charge;
a first control interconnection that is connected to, among the plurality of pixels, a plurality of first pixels each having a first photoelectric conversion unit that converts light from a first filter having a first spectral characteristic into an electrical charge, a first control signal for controlling the first pixels being output to the first control interconnection;
a second control interconnection that is connected to, among the plurality of pixels, a plurality of second pixels each having a second photoelectric conversion unit that converts light from a second filter having a second spectral characteristic different from the first spectral characteristic into an electrical charge, a second control signal for controlling the second pixels being output to the second control interconnection;
a third control interconnection that is connected to the plurality of first pixels and the plurality of second pixels, a third control signal for controlling the first pixels and second pixels being output to the third control interconnection;

a signal processing unit that processes a first signal output from each of the first pixels and a second signal output from each of the second pixels; and a storing unit that stores the first signals and the second signals that are processed by the signal processing unit, wherein the first photoelectric conversion units and the second photoelectric conversion units are provided in a first semiconductor chip, the signal processing unit is provided in a second semiconductor chip that is different from the first semiconductor chip, and the storing unit is provided in a third semiconductor chip that is different from the first semiconductor chip and the second semiconductor chip.

2. The imaging sensor according to claim 1, wherein the first semiconductor chip is stacked on the second semiconductor chip.

3. The imaging sensor according to claim 1, wherein the signal processing unit includes a converting circuit configured to convert each of the first signals and the second signals into a digital signal, and the storing unit stores the digital signals converted from the first signals by the converting circuit and the digital signals converted from the second signals using by the converting circuit.

4. The imaging sensor according to claim 1, wherein the first semiconductor chip is stacked on the third semiconductor chip.

5. The imaging sensor according to claim 1, wherein the signal processing unit includes a first signal processing circuit that processes each of the first signals and a second signal processing circuit that processes each of the second signals, and the storing unit includes a first storing circuit that stores the first signals that are processed by the first signal processing circuit and a second storing circuit that stores the second signals that are processed by the second signal processing circuit.

6. The imaging sensor according to claim 5, wherein the first signal processing circuit includes a first converting circuit that is configured to convert each of the first signals into a first digital signal, and the second signal processing circuit includes a second converting circuit that is configured to convert each of the second signals into a second digital signal, the first storing circuit stores the first digital signals, and the second storing circuit stores the second digital signals.

7. An electronic device that comprises the imaging sensor according to claim 1.

8. An imaging sensor comprising:

a plurality of pixels that each have a photoelectric conversion unit that converts light into an electrical charge;

a first control interconnection that is connected to, among the plurality of pixels, a plurality of first pixels each having a first photoelectric conversion unit that converts light from a first filter having a first spectral characteristic into an electrical charge, a first control signal for controlling the first pixels being output to the first control interconnection;

a second control interconnection that is connected to, among the plurality of pixels, a plurality of second pixels each having a second photoelectric conversion unit that converts light from a second filter having a second spectral characteristic different from the first spectral characteristic into an electrical charge, a second control signal for controlling the second pixels being output to the second control interconnection;

a third control interconnection that is connected to the plurality of first pixels and the plurality of second pixels, a third control signal for controlling the first pixels and the second pixels being output to the third control interconnection, wherein each of the plurality of first pixels includes
a first transfer unit that transfers an electrical charge from the first photoelectric conversion unit with the first control signal, and
a first reset unit that resets, with the third control signal, a potential of a first floating diffusion to which the electrical charge is transferred from the first photoelectric conversion unit, and each of the plurality of second pixels includes
a second transfer unit that transfers an electrical charge from the second photoelectric conversion unit with the second control signal, and
a second reset unit that resets, with the third control signal, a potential of a second floating diffusion to which the electrical charge is transferred from the second photoelectric conversion unit.

9. The imaging sensor according to claim 8, wherein the second control signal is output to the second control interconnection at a timing that is different from a timing that the first control signal is output to the first control interconnection.

10. The imaging sensor according to claim 8, further comprising
a first output interconnection, to which the first signals from the first pixels are output, that is connected to the first pixels, and
a second output interconnection, to which the second signals from the second pixels are output, that is connected to the second pixels, the second output interconnection being different from the first output interconnection.

11. The imaging sensor according to claim 10, further comprising
a first current source circuit that is connected to the first output interconnection and supplies current to the first output interconnection, and
a second current source circuit that is connected to the second output interconnection and supplies current to the second output interconnection.

12. The imaging sensor according to claim 8, further comprising:
a signal processing unit that processes a first signal output from each of the first pixels and a second signal output from each of the second pixels; and
a storing unit that stores the first signals and the second signals that are processed by the signal processing unit.

13. The imaging sensor according to claim 12, wherein the signal processing unit includes a first signal processing circuit that processes the first signals and a second signal processing circuit that processes the second signals, and the storing unit includes a first storing circuit that stores the first signals that are processed by the first signal processing circuit and a second storing circuit that stores the second signals that are processed by the second signal processing circuit.

14. The imaging sensor according to claim 12, wherein the first photoelectric conversion units and the second photoelectric conversion units are provided in a first semiconductor chip, the signal processing unit is provided in a second semiconductor chip that is different from the first semiconductor chip, and the storing unit is provided in a third semiconductor chip that is different from the first semiconductor chip and the second semiconductor chip.

15. An electronic device that comprises the imaging sensor according to claim 8.

16. An imaging sensor comprising:

a plurality of pixels that each have a photoelectric conversion unit that converts light into an electrical charge;

a first control interconnection that is connected to, among the plurality of pixels, a plurality of first pixels each having a first photoelectric conversion unit that converts light from a first filter having a first spectral characteristic into an electrical charge, a first control signal for controlling the first pixels being output to the first control interconnection;

a second control interconnection that is connected to, among the plurality of pixels, a plurality of second pixels each having a second photoelectric conversion unit that converts light from a second filter having a second spectral characteristic different from the first spectral characteristic into an electrical charge, a second control signal for controlling the second pixels being output from the second control interconnection;

a third control interconnection that is connected to the plurality of first pixels and the plurality of second pixels, a third control signal for controlling the first pixels and the second pixels being output from the third control interconnection;

a first output interconnection, to which a first signal from each of the first pixels is output, that is connected to the first pixels, a second output interconnection, to which a second signal from each of the second pixels is output, that is connected to the second pixels, the second output interconnection being different from the first output interconnection, a first current source circuit that is connected to the first output interconnection and supplies current to the first output interconnection, and a second current source circuit that is connected to the second output interconnection and supplies current to the second output interconnection.

17. The imaging sensor according to claim 16, further comprising:

a signal processing unit that processes the first signals output from the first pixels and the second signals output from the second pixels; and a storing unit that stores the first signals and the second signals that are processed by the signal processing unit.

18. The imaging sensor according to claim 17, wherein the signal processing unit includes a first signal processing circuit that processes the first signals and a second signal processing circuit that processes the second signals, and the storing unit includes a first storing circuit that stores the first signals that are processed by the first signal processing circuit and a second storing circuit that stores the second signals that are processed by the second signal processing circuit.

19. The imaging sensor according to claim 17, wherein the first photoelectric conversion units and the second photoelectric conversion units are provided in a first semiconductor chip, the signal processing unit is provided in a second semiconductor chip that is different from the first semiconductor chip, and the storing unit is provided in a third semiconductor chip that is different from the first semiconductor chip and the second semiconductor chip.

20. An electronic device that comprises the imaging sensor according to claim 16.

* * * * *